US012159766B2

(12) United States Patent
Uhm et al.

(10) Patent No.: US 12,159,766 B2
(45) Date of Patent: Dec. 3, 2024

(54) PLASMA GENERATING APPARATUS AND METHOD FOR OPERATING SAME

(71) Applicant: EN2CORE TECHNOLOGY, INC., Daejeon (KR)

(72) Inventors: Sae Hoon Uhm, Hwaseong (KR); Yun Seong Lee, Daejeon (KR); Yeong Hoon Sohn, Daejeon (KR); Se Hong Park, Daejeon (KR)

(73) Assignee: EN2CORE TECHNOLOGY, INC., Daejeon (KR)

( * ) Notice: Subject to any disclaimer, the term of this patent is extended or adjusted under 35 U.S.C. 154(b) by 0 days.

(21) Appl. No.: 18/465,849

(22) Filed: Sep. 12, 2023

(65) Prior Publication Data

US 2024/0006150 A1    Jan. 4, 2024

Related U.S. Application Data

(63) Continuation of application No. 18/055,640, filed on Nov. 15, 2022, now Pat. No. 11,791,133, which is a
(Continued)

(30) Foreign Application Priority Data

Dec. 31, 2018 (KR) .................. 10-2018-0173639
Dec. 23, 2019 (KR) .................. 10-2019-0172614

(51) Int. Cl.
*H01J 37/32*    (2006.01)

(52) U.S. Cl.
CPC ..... *H01J 37/3211* (2013.01); *H01J 37/32183* (2013.01); *H01J 37/32825* (2013.01); *H01J 2237/327* (2013.01)

(58) Field of Classification Search
CPC ............ H01J 37/3211; H01J 37/32183; H01J 37/32449; H01J 37/32697; H01J 37/32825
See application file for complete search history.

(56) References Cited

U.S. PATENT DOCUMENTS 4,587,462 A    5/1986  Buhrer
4,810,935 A  * 3/1989  Boswell ............ H01J 37/32357
                                                315/176
(Continued)

FOREIGN PATENT DOCUMENTS

JP        09-12095      6/2009
KR   10-2004-0034474    4/2004
(Continued)

OTHER PUBLICATIONS

International Search Report dated Apr. 7, 2020; International Application No. PCT-KR2019-018549, 6 pages.
(Continued)

*Primary Examiner* — Tung X Le
(74) *Attorney, Agent, or Firm* — Perkins Coie LLP

(57) ABSTRACT

A plasma generating apparatus according to an embodiment of the present invention comprises: a pair of electrodes arranged in a dielectric discharge tube; an initial discharge induction coil module; and a main discharge induction coil module. The initial discharge induction coil module and the main discharge induction coil module are connected to an RF power source, and the RF power source provides RF power having different resonance frequencies to the initial discharge induction coil module and the main discharge induction coil module, respectively.

9 Claims, 30 Drawing Sheets

Related U.S. Application Data continuation of application No. 16/973,994, filed on Dec. 10, 2020, now Pat. No. 11,532,455, which is a continuation of application No. PCT/KR2019/018549, filed on Dec. 27, 2019.

(56) References Cited

U.S. PATENT DOCUMENTS

| | | | |
|---|---|---|---|
| 5,554,223 A | 9/1996 | Imahashi | |
| 6,228,229 B1 | 5/2001 | Raaijmakers et al. | |
| 6,475,334 B1 | 11/2002 | Harano | |
| 6,495,963 B1* | 12/2002 | Bennett | H01J 37/321 |
| | | | 315/111.21 |
| 7,404,879 B2 | 7/2008 | Tolmachev et al. | |
| 9,627,181 B2 | 4/2017 | Yamazawa | |
| 9,953,811 B2 | 4/2018 | Yamazawa | |
| 10,325,758 B2 | 6/2019 | Yamawaku et al. | |
| 10,541,114 B2 | 1/2020 | Uhm et al. | |
| 11,164,725 B2* | 11/2021 | Zhang | C01B 3/02 |
| 11,532,455 B2 | 12/2022 | Uhm et al. | |
| 2002/0041160 A1 | 4/2002 | Barnes et al. | |
| 2005/0103623 A1 | 5/2005 | Tolmachev et al. | |
| 2007/0090768 A1* | 4/2007 | Shiba | H05B 41/3927 |
| | | | 315/209 R |
| 2008/0156264 A1 | 7/2008 | Fair et al. | |
| 2011/0298376 A1 | 12/2011 | Kanegae et al. | |
| 2013/0267098 A1 | 10/2013 | Maeda et al. | |
| 2014/0190635 A1 | 7/2014 | Lee et al. | |
| 2015/0054521 A1 | 2/2015 | Horiike et al. | |
| 2015/0221477 A1 | 8/2015 | Maeda et al. | |
| 2015/0371832 A1* | 12/2015 | Yanai | H01J 37/32834 |
| | | | 118/723 R |
| 2016/0295676 A1* | 10/2016 | Patelli | H05H 1/2406 |
| 2017/0330772 A1* | 11/2017 | Yamazawa | H01F 21/005 |
| 2018/0122619 A1 | 5/2018 | Uhm et al. | |
| 2018/0315581 A1 | 11/2018 | Hayami et al. | |
| 2018/0358206 A1* | 12/2018 | Ma | B08B 5/00 |
| 2019/0198301 A1* | 6/2019 | Ma | H01J 37/32449 |
| 2021/0139979 A1 | 10/2021 | Uhm et al. | |
| 2023/0083958 A1 | 3/2023 | Uhm et al. | |

FOREIGN PATENT DOCUMENTS

| | | |
|---|---|---|
| KR | 10-2005-0047293 A | 5/2005 |
| KR | 10-1657303 B1 | 9/2016 |
| KR | 10-2017-0028289 | 3/2017 |
| KR | 10-2018-0001804 A | 1/2018 |
| KR | 10-1826883 B1 | 2/2018 |
| KR | 10-2018-0116225 A | 10/2018 |

OTHER PUBLICATIONS

KR Office Action issued in corresponding application No. 10-2020-0097092 dated Feb. 28, 2022, 5 pages.
KR Office Action issued in corresponding application No. 10-2021-0093238 dated Oct. 21, 2021, 5 pages.
Notice of Allowance issued in corresponding application No. U.S. Appl. No. 16/973,994 dated Aug. 17, 2022, 8 pages.
US Office Action in U.S. Appl. No. 16/973,994 dated Jan. 24, 2022, 12 pages.
US Office Action in U.S. Appl. No. 18/055,640 dated Mar. 3, 2023, 6 pages.
Notice of Allowance in U.S. Appl. No. 18/055,640 dated Jun. 28, 2023, 9 pages.
Written Opinion for corresponding application No. PCT-KR2019-018549 dated Apr. 7, 2020, 6 pages.

* cited by examiner

PLASMA GENERATING APPARATUS AND METHOD FOR OPERATING SAME

CROSS-REFERENCE TO RELATED APPLICATIONS

This application is a continuation of U.S. patent application Ser. No. 18/055,640, filed Nov. 15, 2022, which continuation of U.S. patent application Ser. No. 16/973,994, filed Dec. 10, 2020, now U.S. Pat. No. 11,532,455, issued on Dec. 20, 2022, which is a continuation of and claims priority to PCT/KR2019/018549 filed on Dec. 27, 2019, which claims priorities to Korea Patent Application No. KR filed on Dec. 31, 2018 and Korea Patent Application No. KR filed on Dec. 23, 2019, the entireties of which are both hereby incorporated by reference.

TECHNICAL FIELD

The present disclosure relates to a plasma generating apparatus and, more particularly, to an inductively coupled plasma apparatus performing discharging at atmospheric pressure or higher pressure.

BACKGROUND

In general, inductively coupled plasma is generated using a driving frequency of several MHz at a pressure of hundreds of millitorr (mTorr). However, since an inductive electric field is weak, it may be difficult to use inductively coupled plasma for discharging at atmospheric pressure or at high pressure of several Torr or higher. Accordingly, it is necessary to sufficiently increase the strength of an induced electric field and to provide an additional component for initial discharge. Even when discharge at an atmospheric pressure is maintained, the discharge may not be performed for a long period of time due to thermal damage caused by ions from plasma of a dielectric tube.

When inductively coupled plasma discharge is performed by applying RF power to an induction coil surrounding a dielectric tube, the dielectric tube is heated by inductively coupled plasma to be damaged. Therefore, high-power inductively coupled plasma has a structural limitation.

In Korean Patent Registration No. 10-1657303, the present inventors proposed swirl flow to maintain stability of plasma. However, an antenna having a plurality of turns has an increase in an inducted electric field during discharge and is limited in atmospheric pressure discharge because an antenna voltage accelerates ions to a tube wall to cause thermal damage.

In Korean Patent Registration No. 10-1826883, the present inventors proposed an inductively coupled plasma generator having a voltage distribution structure in which a capacitor is inserted between antennas. According to Korean patent registration No. 10-1826883, initial discharge is inducted when a driving frequency does not satisfy a resonance condition, but it is difficult to stably ignite atmospheric pressure discharge because intensity of an electric field is low.

SUMMARY

Example embodiments provide a plasma generating apparatus for generating stable inductively coupled plasma at a near atmospheric pressure or at a pressure of hundreds of Torr or higher.

An atmospheric-pressure plasma generating apparatus according to an example embodiment may include a dielectric discharge tube; an initial discharge induction coil module including an initial discharge induction coil surrounding the dielectric discharge tube, having a plurality of turns, and generating atmospheric initial discharge and an initial discharge capacitor connected to the initial discharge induction coil in series to provide a first resonant frequency; a first electrode and a second electrode, respectively disposed above and below the initial discharge induction coil to provide initial discharge seeds; a DC power supply configured to apply a DC high voltage between the first electrode and the second electrode; a main discharge induction coil module having a second resonant frequency and receiving initial discharge, generated by the initial discharge induction coil module, to generate main inductively coupled plasma; and an RF power supply configured to supply RF power to the initial discharge induction coil module and the main discharge induction coil connected in parallel. The main discharge induction coil includes a plurality of unit antennas disposed to be spaced apart from the initial discharge induction coil and respectively disposed on a plurality of placement planes perpendicular to a central axis of the dielectric discharge tube; a first main capacitor and a second main capacitor, respectively disposed on both ends of the unit antennas; and auxiliary capacitors, respectively connected to the unit antennas in series. The RF power induces initial discharge to the initial discharge induction coil at the first resonant frequency with the help of the DC high voltage. The RF power changes the driving frequency from the first resonant frequency to the second resonant frequency to perform main discharge.

In an example embodiment, the atmospheric-pressure plasma generating apparatus may further include a first detection sensor configured to detect a voltage or current flowing through the initial discharge induction coil. The RF power supply may detect a transition from a capacitively coupled mode to an inductively coupled mode using an output of the first detection sensor, and may change a driving frequency from the first resonant frequency to the second resonant frequency.

In an example embodiment, the first electrode may be disposed above the initial discharge induction coil and may be charged with a positive DC high voltage. The second electrode may be disposed below the initial discharge induction coil, may have a C shape to surround the dielectric discharge tube, and may be charged with a negative DC high voltage.

In an example embodiment, the DC power supply may include an AC-DC converter configured to convert commercial power into a DC voltage; a high-voltage pulse generator receiving the DC voltage to generate a positive DC high-voltage pulse and a negative DC high-voltage pulse; and a controller configured to control the high-voltage pulse generator.

In an example embodiment, the high-voltage pulse generator may include a first transformer including a primary coil configured to receive the DC voltage of the AC-DC converter and a secondary coil configured to generate a positive DC high-voltage pulse; a first power transistor connected to the primary coil of the first transformer; a second transformer including a primary coil configured to receive the DC voltage of the AC-DC converter and a second coil configured to generate a negative DC high-voltage pulse; and a second power transistor connected to the primary coil of the second transformer. The controller may control gates of the first power transistor and the second power transistors. One end of the secondary coil of the first transformer may output a positive DC high-voltage pulse, and the other end of the secondary coil of the first transformer may be grounded. One end of the secondary coil of the second transformer may output a negative DC high-voltage pulse, and the other end of the secondary coil of the second transformer may be grounded.

In an example embodiment, the initial discharge induction coil may be in the form of a solenoid and may be wound in a plurality of layers.

In an example embodiment, the initial discharge induction coil may have a triple structure including an internal solenoid coil, an intermediate solenoid coil, and an external solenoid coil.

In an example embodiment, the initial discharge capacitor may be disposed on each of both ends of the initial discharge induction coil.

In an example embodiment, a coil constituting the unit antenna may have a rectangular cross section.

In an example embodiment, the unit antenna may include: the unit antenna may include: a first antenna disposed to be in contact with the dielectric discharge tube on a placement plane, perpendicular to a central axis, and configured to form a loop; a second antenna disposed to surround the first antenna and configured to form a loop; and a third antenna disposed to surround the second antenna and configured to form a loop.

In an example embodiment, the unit antennas may be disposed on different placement planes, and the number of the unit antennas may be ten.

In an example embodiment, the unit antennas may be divided into a first group, including five unit antennas, and a second group including the other five unit antennas. The unit antennas constituting the first group may be disposed at intervals of 72 degrees in an azimuthal direction, and the unit antennas constituting the second group may be disposed at intervals of 72 degrees in the azimuthal direction.

In an example embodiment, the unit antenna may include a plurality of turns disposed on the same placement plane and may further include a ㅛ-shaped insulating spacer insulating the plurality of turns.

In an example embodiment, the first resonant frequency and the second resonant frequency may be spaced apart from each other by 0.2 MHz or more.

In an example embodiment, the first resonant frequency may be higher than the second resonant frequency.

In an example embodiment, capacitance of the first main capacitor may be the same as capacitance of the second main capacitor and may be twice as high as capacitance of the auxiliary capacitor.

In an example embodiment, a first voltage drop inducted to the initial discharge induction coil at the first resonant frequency may be greater than a second voltage drop inducted to the unit antenna at the second resonant frequency.

In an example embodiment, the sum of inductances of the unit antennas may be greater than inductance of the initial discharge induction coil.

A method for operating atmospheric-pressure plasma generating apparatus according to an example embodiment includes: applying a DC high voltage to a first electrode and a second electrode, disposed to be spaced apart from each other, to provide initial discharge seeds to a dielectric discharge tube; performing initial discharge by supplying AC power of a first resonant frequency to an initial discharge induction coil module including an initial discharge induction coil surrounding the dielectric discharge tube, having a plurality of turns, and generating atmospheric-pressure initial discharge and an initial discharge capacitor connected to the initial discharge induction coil in series to provide the first resonant frequency; and inducing main inductively coupled plasma from the initial discharge by supplying AC power of a second resonant frequency, different from the first resonant frequency, to a main discharge induction coil module connected to the initial discharge induction coil module in parallel.

In an example embodiment, the method may further include: detecting current flowing through the initial discharge induction coil or a drop of a voltage applied to both ends of the initial discharge induction coil. When the current flowing through the initial discharge induction coil or the drop of the voltage applied to both ends of the initial discharge induction coil is greater than or equal to a threshold value, an RF power supply may change a driving frequency from the first resonant frequency to the second resonant frequency to perform main discharge in the unit antennas.

In an example embodiment, the main discharge induction coil module may include: a plurality of unit antennas disposed to be spaced apart from the initial discharge induction coil, respectively disposed on a plurality of placement planes perpendicular to a central axis of the dielectric discharge tube, and connected in series; a first main capacitor and a second main capacitor, respectively disposed on both ends of the unit antennas; and auxiliary capacitors connected between the unit antennas in series. An RF power supply may induce initial discharge to the initial discharge induction coil at the first resonant frequency with the help of the DC high voltage. The RF power supply may change a driving frequency from the first resonant frequency to the second resonant frequency to perform main discharge in the unit antennas.

A plasma generating apparatus according to an example embodiment includes: a dielectric discharge tube; a seed charge generator configured to generate seed charges in the dielectric discharge tube; an initial discharge induction coil module including an initial discharge induction coil surrounding the dielectric discharge tube and receiving the seed charges to generate initial discharge and a first impedance matching network connected to the initial discharge induction coil to provide a first resonant frequency; a main discharge induction coil module including a plurality of unit antennas disposed to be spaced apart from the initial discharge induction coil, surrounding the dielectric discharge tube, and receiving the initial discharge to generate main inductively coupled plasma and a second impedance matching network connected to the plurality of unit antennas to provide a second resonant frequency; and an RF power supply configured to supply power to the initial discharge induction coil module and the main discharge induction coil module.

In an example embodiment, the seed charge generator may include: a first electrode and a second electrode disposed on the dielectric discharge tube to provide seed charges; and a DC power supply configured to apply a DC high voltage between the first electrode and the second electrode.

In an example embodiment, the first electrode may be disposed to be in contact with an external sidewall of the dielectric discharge tube, and the second electrode may be disposed on a central axis of the dielectric discharge tube and is electrically grounded.

In an example embodiment, the second electrode may be a nozzle for injecting a gas.

In an example embodiment, the DC power supply may include: an AC-DC converter configured to convert commercial AC power into a DC voltage; a high-voltage pulse generator receiving the DC voltage to generate at least one of a positive DC high-voltage pulse and a negative DC high-voltage pulse; and a controller configured to control the high-voltage pulse generator.

In an example embodiment, the high-voltage pulse generator may include: a first high-voltage pulse generator receiving the DC voltage to generate a first high-voltage pulse; and a second high-voltage pulse generator receiving the DC voltage to generate a second high-voltage pulse.

In an example embodiment, the controller configured to control the high-voltage pulse generator may include: a first controller configured to control the first high-voltage pulse generator; and a second controller configured to control the second high-voltage pulse generator. The first high-voltage pulse may be applied to the first electrode, the second high-voltage pulse may be applied to the second electrode, and the first electrode and the second electrode may be disposed on an external sidewall of the dielectric discharge tube to be spaced apart from each other.

In an example embodiment, the high-voltage pulse generator may include: a first transformer including a primary coil configured to receive the DC voltage of the AC-DC converter and a secondary coil configured to generate a positive DC high-voltage pulse; a first power transistor connected between a ground and the primary coil of the first transformer; a second transformer including a primary coil configured to receive the DC voltage of the AC-DC converter and a secondary coil configured to generate a negative DC high-voltage pulse; and a second power transistor connected to a ground and the primary coil of the second transistor. The controller may control gates of the first power transistor and the second power transistor. One end of the secondary coil of the first transformer may output a positive DC high-voltage pulse, and the other end of the secondary coil of the first transformer may be grounded. One end of the secondary coil of the second transformer may output a negative DC high-voltage pulse, and the other end of the secondary coil of the second transformer may be grounded.

In an example embodiment, the high-voltage pulse generator may include: a transformer including a primary coil configured to receive the DC voltage of the AC-DC converter and a secondary coil configured to a positive DC high-voltage pulse; an inductor connected to the primary coil of the transformer in parallel; a power transistor having one end grounded, and connected to the primary coil of the transformer in series; a resistor connected to the power transistor in parallel; a capacitor connected to the power transistor in parallel; and a diode disposed between the resistor and the capacitor connected to the other end of the power transistor in parallel. The controller may control a gate of the power transistor. One end of the secondary coil of the transformer may output a negative DC high-voltage pulse, and the other end of the secondary coil of the transistor may be grounded.

In an example embodiment, the high-voltage pulse generator may include: a transformer including a primary coil configured to receive the DC voltage of the AC-DC converter and a secondary coil configured to generate a negative DC high voltage; an inductor connected to the primary coil of the transformer in parallel; and a power transistor connected between a ground and the primary coil of the transformer. The controller may control a gate of the power transistor. On end of the secondary coil of the transformer may output a negative DC high-voltage pulse, and the other end of the secondary coil of the transformer may be grounded.

In an example embodiment, the high-voltage pulse generator may include: a transformer including a primary coil configured to receive the DC voltage of the AC-DC converter and a secondary coil configured to generate a negative DC high-voltage pulse; an inductor connected to the primary coil of the transformer in parallel; a power transistor connected between a ground and the primary coil of the transformer in series; a resistor and a capacitor, each having one end connected to the DC voltage of the AC-DC converter, connected to each other in parallel; and a diode having one end connected between the power transistor and the primary coil and the other end connected to the other end of the resistor and the capacitor connected in parallel. The controller may control a gate of the power transistor. One end of the secondary coil of the transformer may output a negative DC high-voltage pulse, and the other end of the secondary coil of the transformer may be grounded.

In an example embodiment, the high-voltage pulse generator may include: a transformer including a primary coil configured to receive the DC voltage of the AC-DC converter and a secondary coil configured to generate a positive DC high-voltage pulse; an inductor connected to the primary coil of the transformer in parallel; a power transistor connected between a ground and the primary coil of the transformer in series; a resistor connected to the power transistor in parallel; a capacitor connected to the power transistor in parallel; and a diode disposed between the resistor and the capacitor connected to the other end of the power transistor in parallel. The primary coil and the secondary coil may have a phase difference of 180 degrees. The controller may control a gate of the power transistor. One end of the secondary coil of the transformer may output a positive DC high-voltage pulse, and the other end of the secondary coil of the transformer may be grounded.

In an example embodiment, the first impedance matching network may include an initial discharge capacitor connected to the initial discharge induction coil in series.

In an example embodiment, the first impedance matching network may include a pair of initial discharge capacitors, respectively connected to both ends of the initial discharge induction coil.

In an example embodiment, the first impedance matching network may include a transformer and a pair of initial discharge capacitors, respectively connected to both ends of the initial discharge inductor coil. A primary coil of the transformer may be connected to an output terminal of the RF power supply, and a secondary coil of the transformer may be connected to both ends of the initial discharge inductor coil and the pair of initial discharge capacitors connected in series.

In an example embodiment, the first impedance matching network may include: a first initial discharge capacitor connected to the initial discharge induction coil in parallel; and a second initial discharge capacitor and a third initial discharge capacitor, respectively connected to both ends of the initial discharge capacitor and the initial discharge induction coil connected in parallel.

In an example embodiment, in the main discharge inductor coil module, the plurality of unit antennas may be respectively disposed on a plurality of placemen plane, perpendicular to a central axis of the dielectric discharge tube, and are connected in series, auxiliary capacitors may be connected between adjacent unit antennas in series, and the second impedance matching network may include a first capacitor and a second main capacitor, respectively connected to both ends of the unit antennas connected in series.

In an example embodiment, the RF power supply may include: a rectifier configured to convert commercial power into DC power; an inverter configured to receive the DC power and to converter the received DC power into RF power; and a controller configured to control the switching signals to control a driving frequency and power. The RF power supply may operate at the first resonant frequency during initial discharge and may operate at the second resonant frequency when main inductively coupled plasma is generated.

In an example embodiment, the RF power supply may include: a first RF power supply configured to supply AC power to the initial discharge induction coil module and operating at the first resonant frequency; and a second RF power supply configured to supply AC power to the main discharge induction coil module and operating at the second resonant frequency. The first RF power supply may include: a first rectifier configured to convert AC power into DC power; a first inverter configured to receive DC power of the first rectifier and to supply AC power of the first resonant frequency to the initial discharge induction coil module; and a first controller configured to control an output of the first inverter. The second RF power supply may include: a second rectifier configured to convert AC power into DC power; a second inverter configured to receive DC power of the second rectifier and to supply AC power of the second of a second resonant frequency to the main discharge induction coil module; and a second controller configured to control an output of the second inverter.

In an example embodiment, the RF power supply may include: a rectifier configured to AC power into DC power; a first RF power supply configured to receive DC power of the rectifier and to supply AC power to the initial discharge induction coil module and operating at the first resonant frequency; and a second RF power supply configured to receive DC power of the rectifier and to supply AC power to the main discharge induction coil and operating at the second resonant frequency.

In an example embodiment, the first RF power supply may include: a first inverter configured to receive DC power of the rectifier and to convert the received DC power into first AC power of a first resonant frequency; a first controller configured to control the first inverter; a second inverter configured to receive DC power of the rectifier and to convert the received DC power into AC power of a second resonant frequency; and a second controller configured to control the second inverter.

In an example embodiment, the first RF power supply may operate within a frequency range from 4 MHz to 5 MHz, and the second RF power supply may operate within in a frequency range from 400 kHz to 4 MHz.

In an example embodiment, each of the first inverter and the second inverter may have a full-bridge structure or a half-bridge structure.

In an example embodiment, the plasma generating apparatus may further include: a first detection sensor configured to detect current flowing through the initial discharge induction coil. The RF power supply may detect a transition from a capacitively coupled mode to an inductively coupled mode using an output of the first detection sensor to change a driving frequency from the first resonant frequency to the second resonant frequency.

In an example embodiment, the plasma generating apparatus may further include: a second detection sensor configured to detect current flowing through the main discharge induction coil module. The RF power supply may detect that the main inductively coupled plasma is generated using an output of the second detection sensor to interrupt power supplied to the initial discharge induction coil module.

In an example embodiment, the first electrode may be disposed above the initial discharge induction coil to be charged with a positive DC high voltage, and the second electrode may be disposed below the initial discharge induction coil, may have a C shape to surround the dielectric discharge tube, and may be charged with a negative DC high voltage.

In an example embodiment, the initial discharge induction coil may be in the form of a solenoid and may be wound in multiple layers.

In an example embodiment, the initial discharge induction coil may have a triple structure including an internal solenoid coil, an intermediate solenoid coil, and an external solenoid coil.

In an example embodiment, the unit antenna may include: a first antenna disposed to be in contact with the dielectric discharge tube on a placement plane, perpendicular to a central axis, and configured to form a loop; a second antenna disposed to surround the first antenna and configured to form a loop; and a third antenna disposed to surround the second antenna and configured to form a loop.

In an example embodiment, the unit antenna may include a plurality of turns disposed on the same placement plane and may further include a ⊥-shaped insulating spacer insulating the plurality of turns.

A method for operating a plasma generating apparatus according to an example embodiment may include: injecting a first gas into a dielectric discharge tube; providing seed charges to an inside of the dielectric discharge tube using the first gas; performing initial discharge of the first gas from the seed charges with AC power of a first resonant frequency using an initial discharge induction coil and a first impedance matching network connected to the initial discharge induction coil; and generating main inductively coupled plasma of the first gas with AC power of a second resonant frequency, different from the first resonant frequency, using a plurality of unit antennas and a second impedance matching network.

In an example embodiment, the method may further include maintaining the main inductively coupled plasma while changing the first gas into a second gas.

In an example embodiment, after the initial discharge of the first gas, the method may further include: generating preliminary main inductively coupled plasma of the first gas from the initial discharge with AC power of a frequency near a second resonant frequency using a plurality of unit antennas and a second impedance matching network.

In an example embodiment, the method may further include: interrupting the AC power of the first resonant frequency when the preliminary main inductively coupled plasma is generated.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Figure 1:
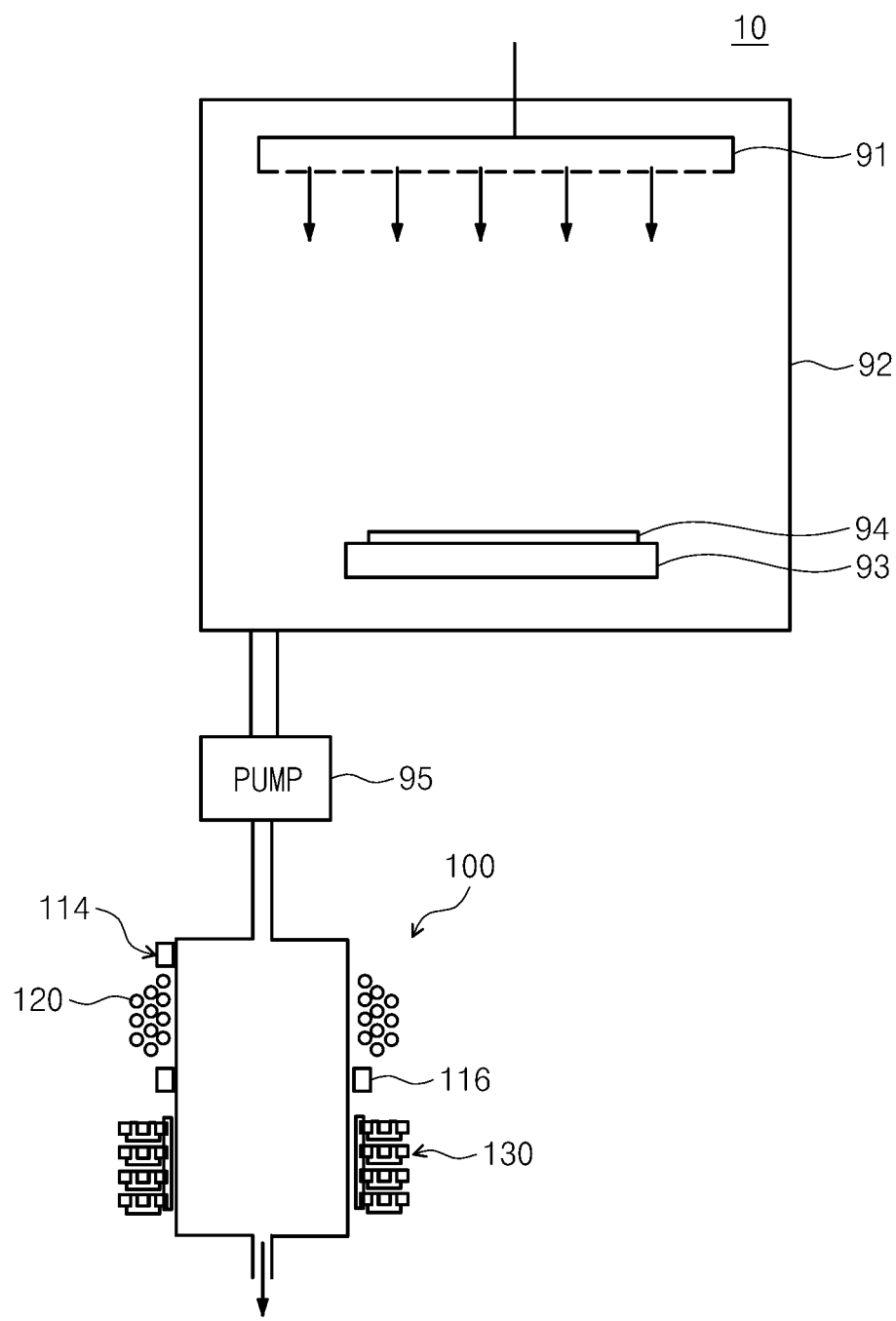
FIG. 1 is a conceptual diagram illustrating an application example of an atmospheric-pressure plasma device according to an example embodiment of the present disclosure.

Hereinafter, example embodiments will be described with reference to the accompanying drawings.

A plasma generator according to an example embodiment of the present disclosure includes a pair of electrodes disposed in a dielectric discharge tube, an initial discharge induction coil module, and a main discharge induction coil module. The initial discharge induction coil module and the main discharge induction coil module are connected to an RF power supply in parallel, and the RF power supply selectively supplies RF power to the initial discharge induction coil module or the main discharge induction coil module according to a resonant frequency.

The initial discharge module includes an antenna advantageous for ignition, and the main discharge module has antenna characteristics advantageous for discharge maintenance. The initial discharge module and the main discharge module, connected to each other in parallel, have different impedance characteristics depending on a driving frequency. The initial discharge module has a first resonant frequency, and the main discharge module has a second resonant frequency. When current flows at the first resonant frequency, the current mainly flows to the initial discharge module. Since impedance is relatively high at the first resonant frequency in a route rather than resonance, a relatively small amount of current flows. When current flows at the second resonant frequency, the current mainly flows to the main discharge module. Even when there are three or more discharge modules, if different resonant frequencies are allocated to the respective discharge modules, current may be supplied to a desired discharge module. Therefore, according to the present disclosure, impedance matching may be performed in a wide actual resistance range, a wide discharge control range (a flow rate, power, and a pressure) may be implemented, and current may to be switched to a multi-purposed discharge module to change a discharge function.

The pair of electrodes may be respectively disposed above and below the initial discharge induction coil of the initial discharge module to generate to apply a DC voltage at an atmospheric pressure to generate an electrostatic vertical electric field E_ig in a direction of a central axis of the dielectric discharge tube for performing initial discharge and to generate seed charges.

The initial discharge induction coil module is disposed between the pair of electrodes, and includes an initial discharge induction coil and an initial discharge capacitor connected to the initial discharge induction coil in series. The main discharge module and the initial discharge module are connected in parallel. The initial discharge induction coil module has a first resonant frequency, and receives RF power having the first resonant frequency from the RF power supply in an initial discharge mode to perform initial discharge. The main discharge module does not perform discharge due to high impedance at the first resonant frequency. Plasma, generated by the initial discharge induction coil, transitions from a capacitively coupled mode (or an E mode) to an inductively coupled mode (or an H mode). In the capacitively coupled mode (or the E mode), the initial discharge induction coil generates a potential difference on both ends of the initial discharge induction coil at the first resonant frequency. After the transition to the inductively coupled mode (or the H mode), actual plasma resistance is increased and the first current, flowing to the initial discharge inductor coil, is decreased.

The main discharge module includes serially connected unit antennas spaced apart from the initial discharge induction coil and respectively disposed on a plurality of placement planes, a first main capacitor and a second main capacitor respectively disposed both ends of the unit antennas, and an auxiliary capacitor connected between the unit antennas in series. The main discharge module and the initial discharge module are connected in parallel. The main discharge module has a second resonant frequency. During a transition from the capacitively coupled mode (or the E mode) to the inductively coupled mode (or the H mode) due to the initial discharge induction coil, the RF power supply changes a driving frequency from the first resonant frequency to the second resonant frequency. At the same time, the DC voltage is removed from the pair of electrodes. Accordingly, the initial discharge module does not perform discharge because current does not flow due to high impedance, and the main discharge module allows current to flow due to low impedance and stably generates inductively coupled plasma.

Hereinafter, the present disclosure will be described in more detail based on preferred embodiments. However, these embodiments are for better understanding of the present disclosure, and it is obvious to those skilled in the art that the scope of the present disclosure is not limited thereto. In addition, in the case in which detailed description of known functions or configurations in relation to the present disclosure is judged as unnecessarily making the essence of the present disclosure vague, the detailed description will be excluded.

FIG. 1 is a conceptual diagram illustrating an application example of an atmospheric-pressure plasma device according to an example embodiment of the present disclosure.

Referring to FIG. 1, a substrate processing apparatus 10 may include a substrate holder 93 provided inside of a vacuum container 92, and may perform a deposition process, an etching process, a diffusion process, or an ion implantation process on a substrate 94 disposed on the substrate holder 93. The vacuum container 92 is exhausted by a vacuum pump 95, and an exhaust gas is purified through an atmospheric-pressure plasma generation device 100 to be discharged to an external entity. The exhaust gas includes contaminants such as fine particles, deadly toxic gases, and greenhouse gases.

The exhaust gas is discharged after being purified through a gas scrubber. The gas scrubber includes a combustion-type gas scrubber or a plasma-type gas scrubber.

An atmospheric pressure discharge plasma method may include a high-voltage flat-type plasma method, an arc torch method, and an induction heating plasma method. The high-voltage flat-type plasma method has high discharge maintenance, but encounters difficulty in establish low plasma density and high temperature conditions at a high operating pressure. Therefore, an effect of removing toxic substances by thermochemical decomposition is low.

High-temperature plasma such as an arc torch provides a high reaction temperature, but exhibits low decomposition efficiency because a process gas is not directly injected into the plasma and low durability of an electrode for generating an arc.

An atmospheric-pressure plasma device according to an example embodiment may implement high plasma density ($10^{16}/cm^3$) and high gas temperature (3000 degrees Celsius) at a pressure of 100 Torr or more using inductively coupled plasma. Accordingly, the atmospheric-pressure plasma device may be disposed in back of a vacuum pump to decompose and process a noxious gas flowing after being mixed with a gas of several tens of standard liter per minute (SLM) or more under atmospheric pressure. The noxious gas may be a $C_xF_y$ or $S_xF_y$ gas. In the present disclosure, inductively coupled discharge of a $C_xF_y$ gas, which is conventionally difficult to be discharged at atmospheric pressure, may be performed at the atmospheric pressure. An atmospheric pressure f according to an example embodiment may be used in a process such as $CO_2$ reforming.

Figure 2A:
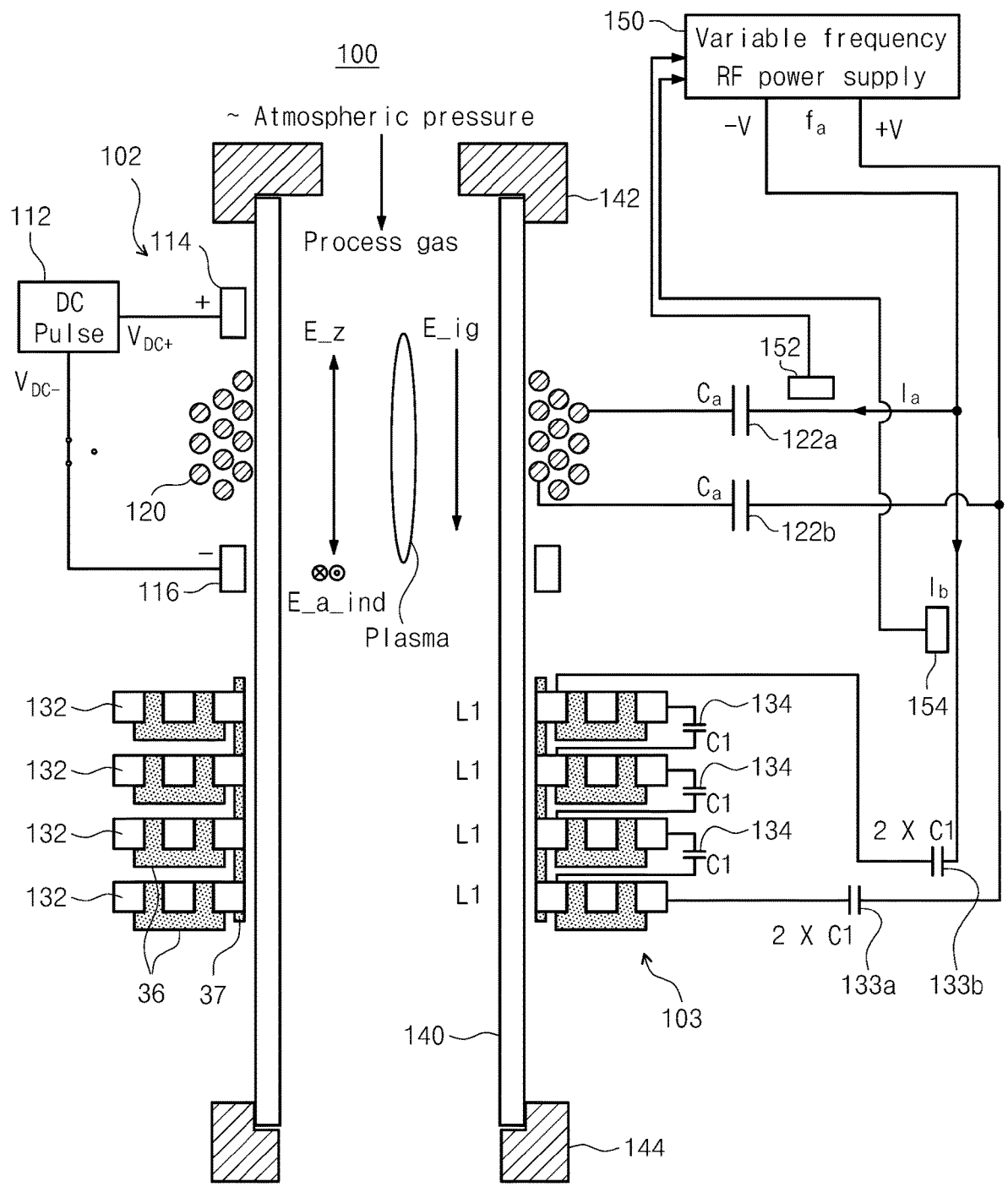
FIG. 2A is a conceptual diagram illustrating an initial discharge operation of an atmospheric pressure device according to an example embodiment of the present disclosure.

FIG. 2A is a conceptual diagram illustrating an initial discharge operation of an atmospheric pressure device according to an example embodiment of the present disclosure.

Figure 2B:
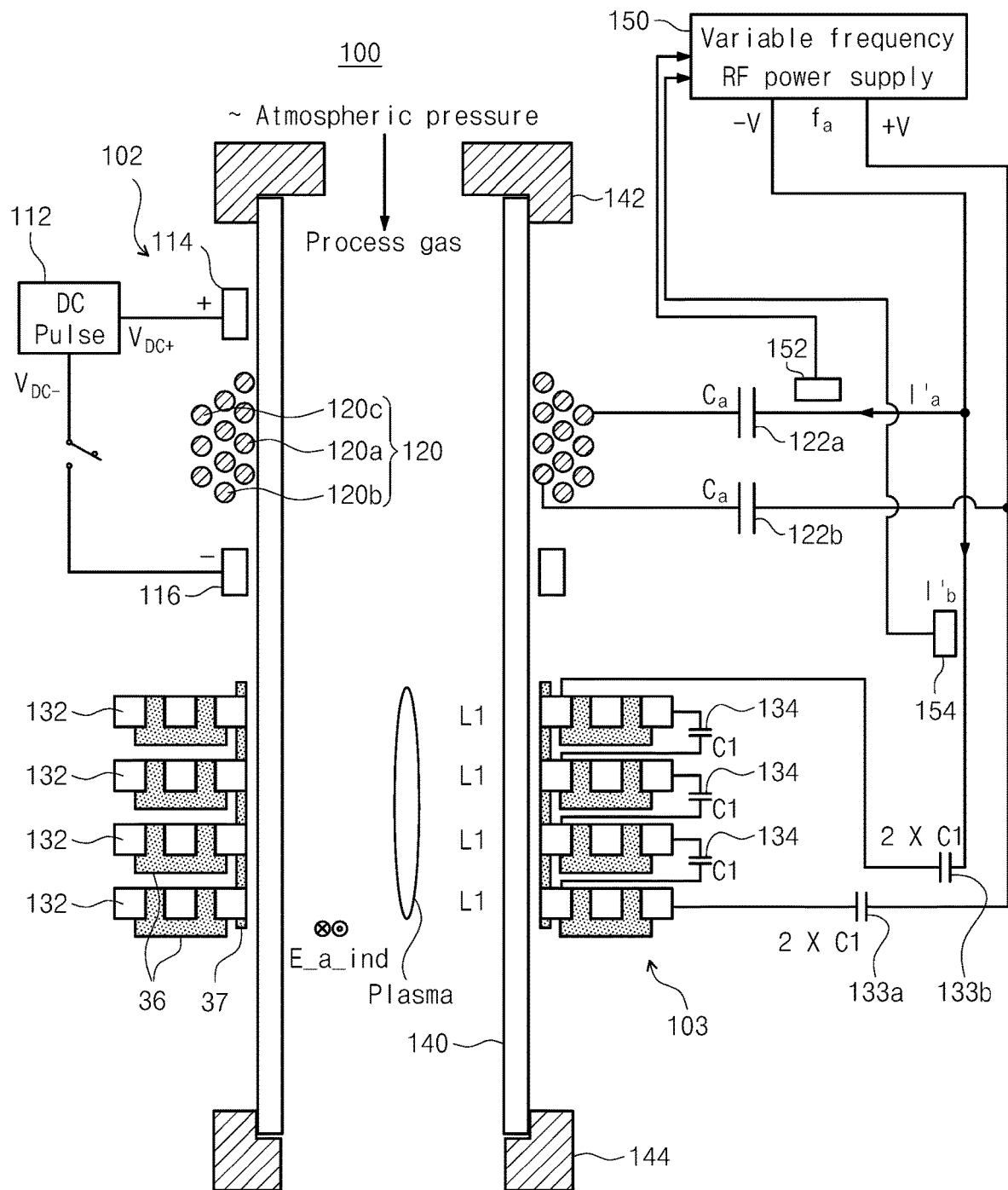
FIG. 2B is a conceptual diagram illustrating a main discharge operation of an atmospheric-pressure plasma device according to an example embodiment of the present disclosure.

FIG. 2B is a conceptual diagram illustrating a main discharge operation of an atmospheric-pressure plasma device according to an example embodiment of the present disclosure.

Figure 3:
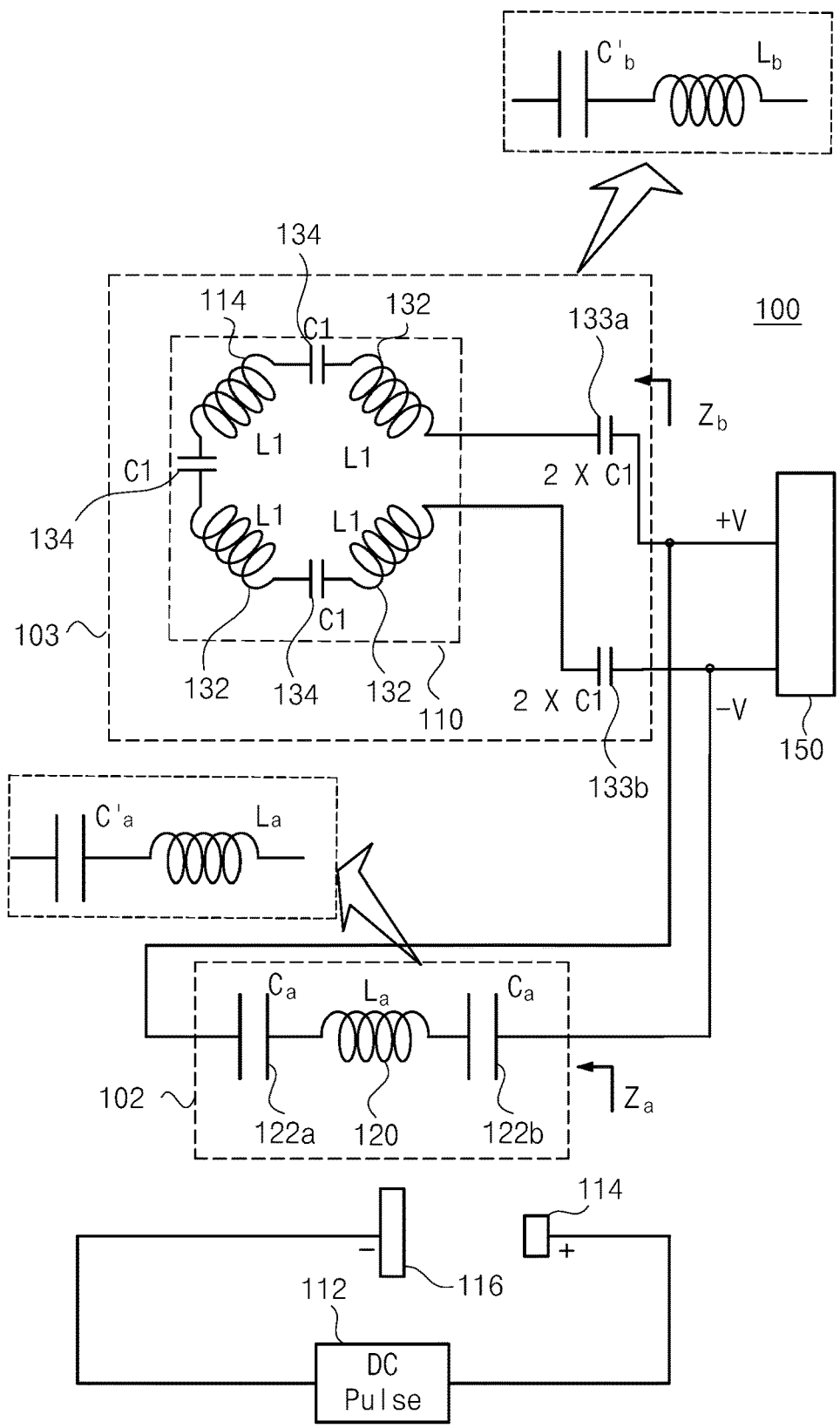
FIG. 3 is a conceptual diagram illustrating the atmospheric pressure in FIG. 2A from a circuit point of view.

FIG. 3 is a conceptual diagram illustrating the atmospheric pressure in FIG. 2A from a circuit point of view.

Figure 4:
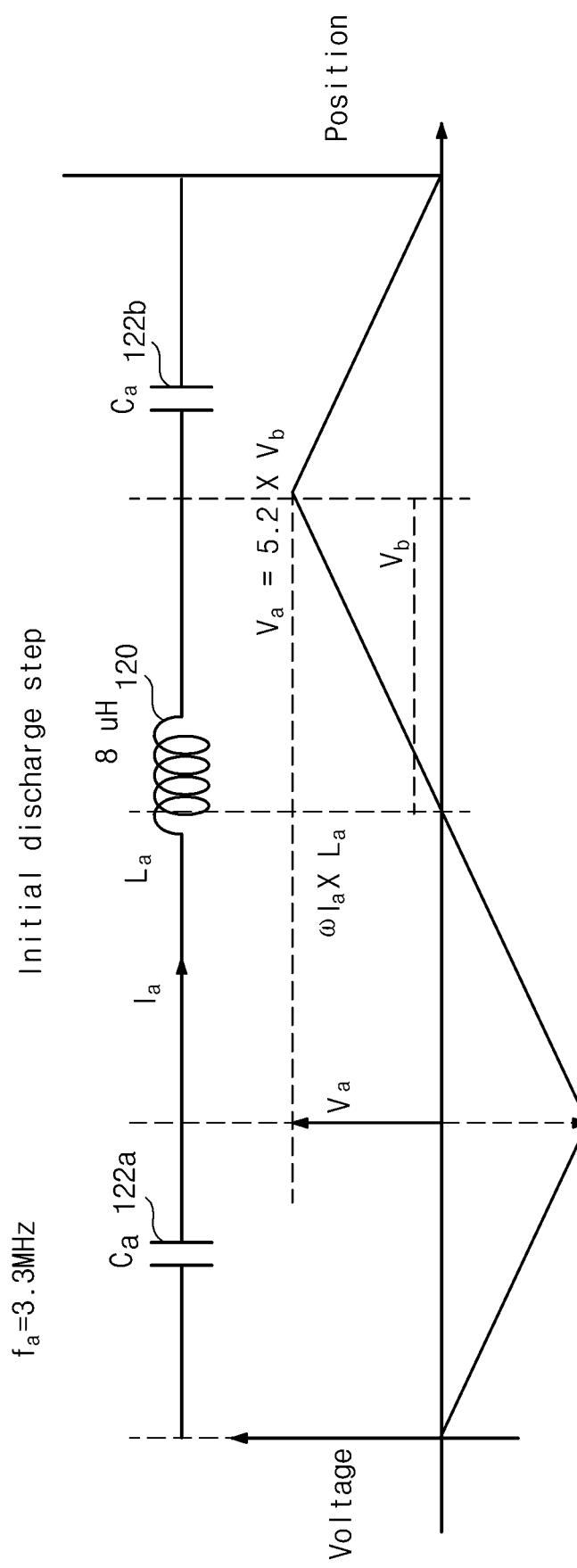
FIG. 4 is a conceptual diagram illustrating division of a voltage applied to an initial discharge induction coil during an initial discharge operation of the atmospheric-pressure plasma device in FIG. 2A.

FIG. 4 is a conceptual diagram illustrating division of a voltage applied to an initial discharge induction coil during an initial discharge operation of the atmospheric-pressure plasma device FIG. 2A.

Figure 5:
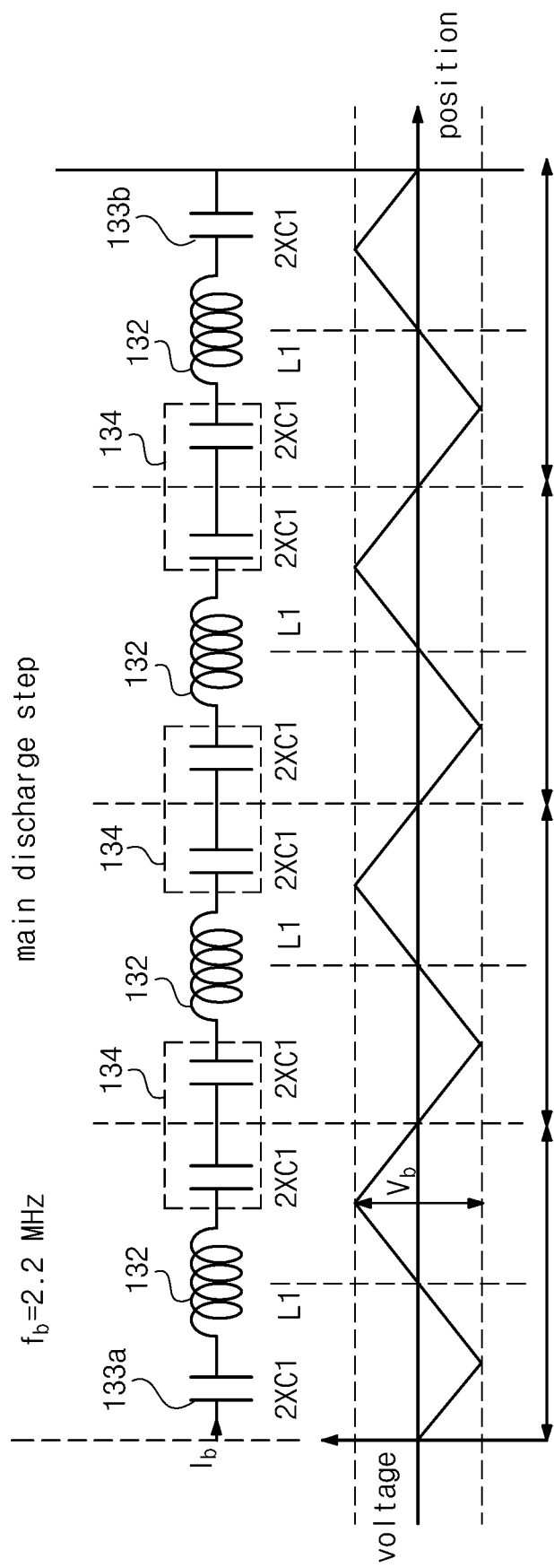
FIG. 5 is a conceptual diagram illustrating division of a voltage applied to a main discharge induction coil during a main discharge operation of the atmospheric-pressure plasma device in FIG. 2A.

FIG. 5 is a conceptual diagram illustrating division of a voltage applied to a main discharge induction coil during a main discharge operation of the atmospheric-pressure plasma device in FIG. 2A.

Figure 6:
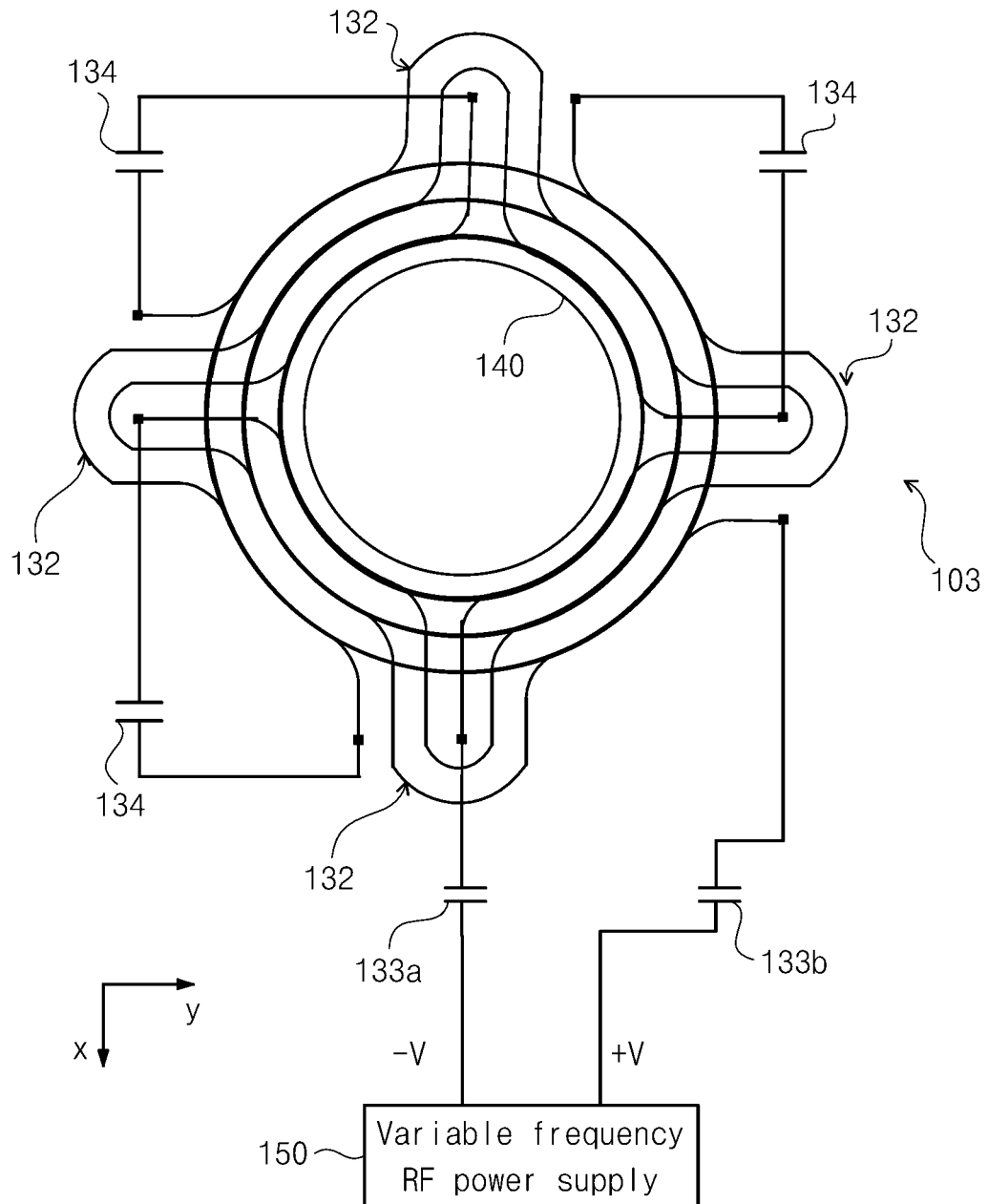
FIG. 6 is a plan view illustrating a disposition relationship of unit antennas of a main discharge induction coil module according to an example embodiment of the present disclosure.

FIG. 6 is a plan view illustrating a disposition relationship of unit antennas of a main discharge induction coil module according to an example embodiment of the present disclosure.

Figure 7:
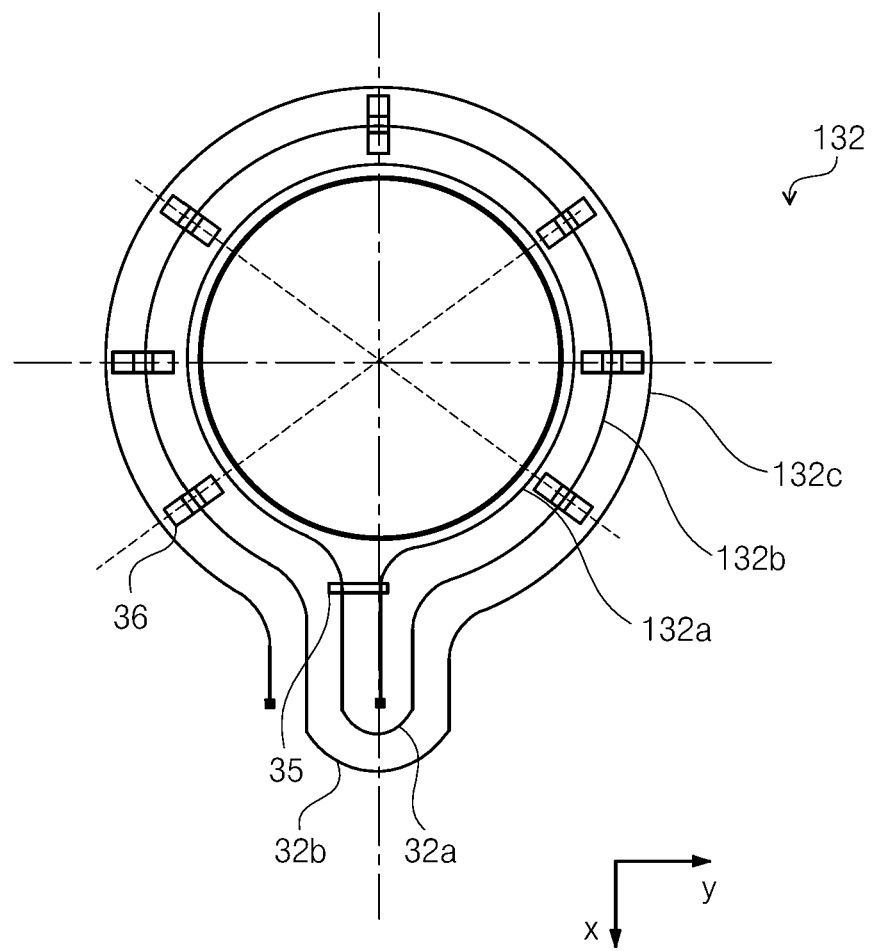
FIG. 7 is a plan view of unit antennas of a main discharge induction coil module according to an example embodiment of the present disclosure.

FIG. 7 is a plan view of unit antennas of a main discharge induction coil module according to an example embodiment of the present disclosure.

Figure 8:
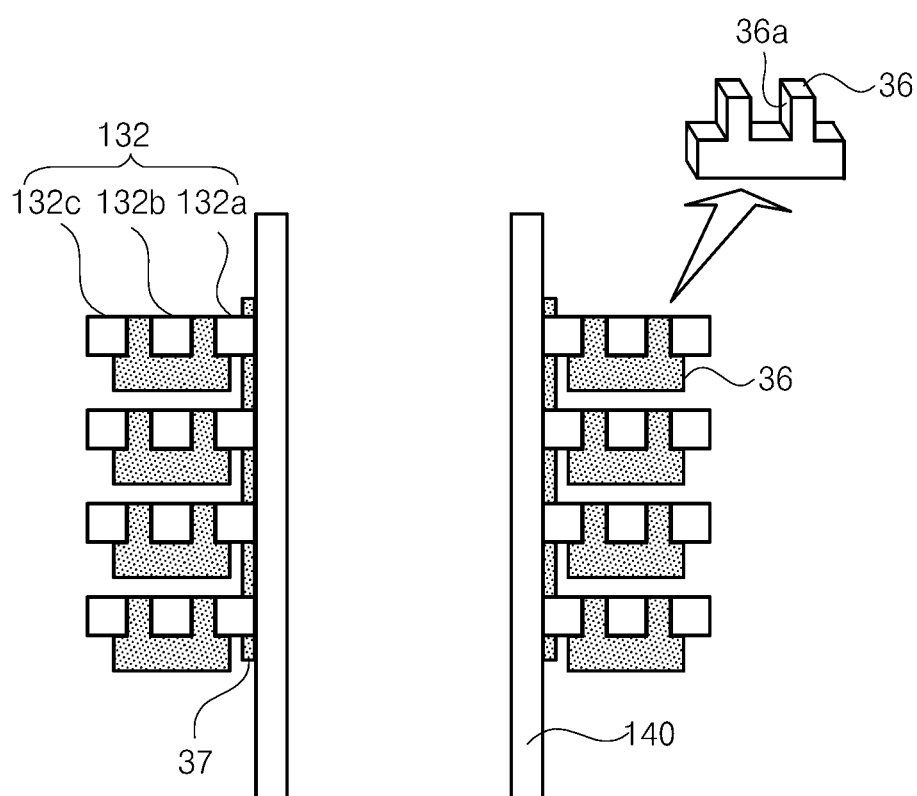
FIG. 8 is a cross-sectional view illustrating an insulating state of unit antennas of a main discharge induction coil module according to an example embodiment of the present disclosure.

FIG. 8 is a cross-sectional view illustrating an insulating state of unit antennas of a main discharge induction coil module according to an example embodiment of the present disclosure.

Figure 9:
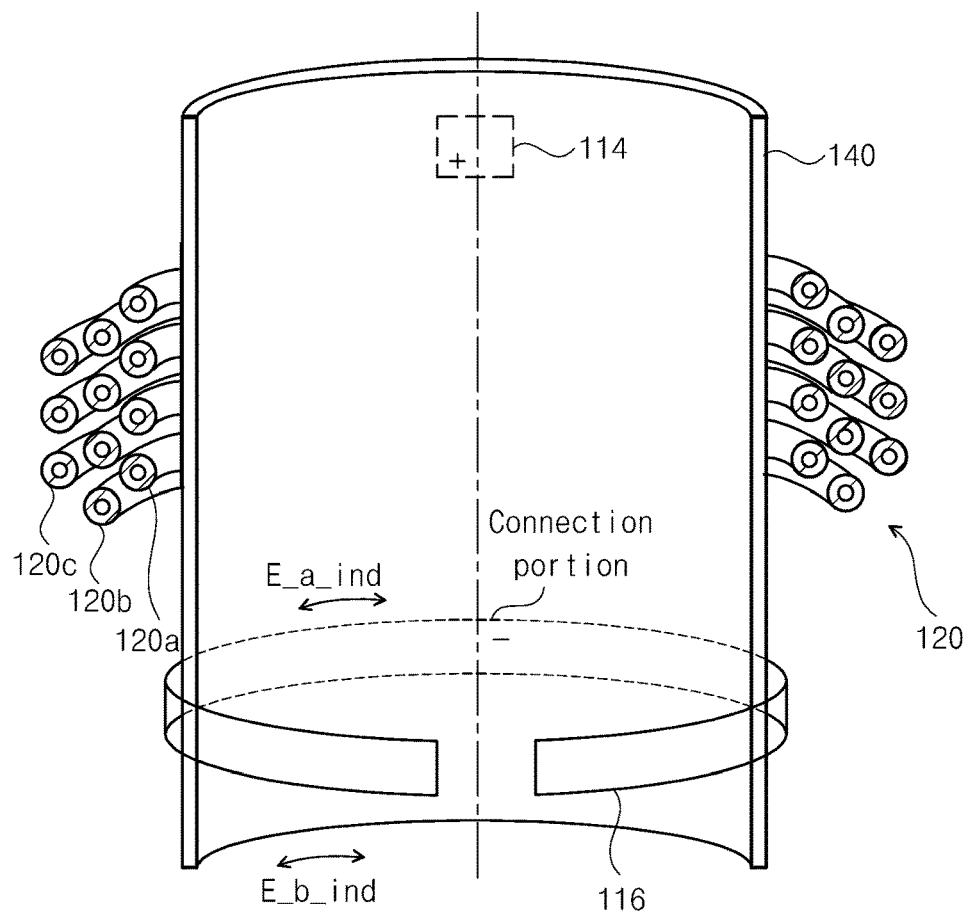
FIG. 9 is a cutaway perspective view illustrating a disposition relationship of a first electrode and a second electrode according to an example embodiment of the present disclosure.

FIG. 9 is a cutaway perspective view illustrating a disposition relationship of a first electrode and a second electrode according to an example embodiment of the present disclosure.

Referring to FIGS. 2 to 9, an atmospheric-pressure plasma generating apparatus 100 may include a dielectric discharge tube 140; an initial discharge induction coil module 102 including an initial discharge induction coil 120 surrounding the dielectric discharge tube 140, having a plurality of turns, and generating atmospheric-pressure initial discharge and initial discharge capacitors 122a and 122b connected to the initial discharge induction coil 120 in series to provide a first resonant frequency fa; a first electrode 114 and a second electrode 116 disposed above and below the initial discharge induction coil 120 to provide initial discharge seeds; a DC power supply 112 configured to apply a DC high voltage between the first electrode 114 and the second electrode 116; a main discharge induction coil module 103 having a second resonant frequency fb and configured to receive the initial discharge generated by the initial discharge induction coil 102 to generate main inductively coupled plasma; and an RF power supply 150 configured to supply RF power to the initial discharge induction coil module 102 and the main discharge induction coil module 103 connected in parallel and to change a driving frequency.

The main discharge induction coil module 103 includes a plurality of unit antennas 132 disposed to be spaced apart from the initial discharge induction coil 120, respectively disposed on a plurality of placement planes perpendicular to a central axis of the dielectric discharge tube 140, and connected to each other in series; a first main capacitor 133a and a second main capacitor 133b, respectively disposed on both ends of the unit antennas 132; and auxiliary capacitors 134 connected to each other between the unit antennas 132 in series.

The RF power supply 150 induces initial discharge to the initial discharge induction coil 120 at the first resonant frequency fa with the help of the DC high voltage. The RF power supply 150 changes the driving frequency from the first resonance frequency fa to the second resonance frequency fb to perform main discharge.

Due to a low inducted electric field, it may be difficult for atmospheric pressure inductively coupled plasma to generate ignition (or initial discharge). Therefore, a help of DC discharge performed by the first electrode 114 and the second electrode 116 is given to achieve stable initial discharge. On the other hand, it may be difficult for DC discharge to form high plasma density. An electrode, disposed outside of the dielectric discharge tube 140, causes the dielectric discharge tube 140 to be damaged by a high electric field E_ig.

The initial discharge induction coil 120 generates initial inductively coupled plasma with the help of seed charges generated by DC discharge. To this end, a strong electrostatic vertical electric field E_z in a direction of the central axis of the dielectric discharge tube 140 is required. The strong electrostatic vertical electric field E_z depends on a structure of the initial discharge induction coil. The electrostatic vertical electric field E_z of the initial discharge induction coil 120 may establish a capacitively coupled mode. The electrostatic vertical electric field E_z may be generated by a high potential difference Va applied to both ends of the initial discharge induction coil. The electrostatic vertical electric field E_z may be in proportion to inductance La of the initial discharge induction coil 120. However, when the inductance La of the initial discharge induction coil 120 is excessively high, the power of the RF power supply 150 is not efficiently transferred to a load (an initial discharge induction coil) due to high impedance. Therefore, the initial discharge capacitors 122a and 122b are connected the initial discharge induction coil 120 in series to provide the first resonant frequency fa. When the RF power supply 150 operates at the first resonant frequency fa, an imaginary part of impedance Za viewed from an output terminal of the RF power supply toward the initial discharge induction coil 120 may be removed. Accordingly, the RF power supply 150 may stably transfer RF power to the initial discharge induction coil. In addition, since the initial discharge induction coil 120 has high inductance, a high potential difference Va may be induced to both ends of the initial discharge induction coil 120, and thus, the electrostatic vertical electric field E_z may establish the capacitively coupled mode. In the capacitively coupled mode, streamer discharge is locally performed in a direction of the central axis of the dielectric discharge tube 140.

When plasma is sufficiently generated by the capacitively coupled mode, an induced electric field E_a_ind in an azimuthal direction is generated by first current Ia flowing through the initial discharge induction coil 120. Due to the induced electric field E_a_ind, plasma transitions from a capacitively coupled mode to an inductively coupled mode. In the inductively coupled mode established by the initial discharge induction coil 120, plasma is generated overall in the dielectric discharge tube 140. In the inductively coupled mode, the first current Ia flowing through the initial discharge induction coil and the potential difference Va applied to both ends of the initial discharge induction coil are decreased, as compared with those in the capacitively coupled mode.

However, in the inductively coupled mode established by the initial discharge induction coil 120, the high inductance La of the initial discharge induction coil 120 allows a high potential difference to be still maintained at both ends of the initial discharge induction coil. Accordingly, a plasma sheath is formed between plasma having constant plasma potential and the initial discharge induction coil 120, and ions are accelerated to an internal wall of the dielectric discharge tube 120 through the plasma sheath. Thus, the dielectric discharge tube 120 is damaged by heat and discharge efficiency is reduced.

In the present disclosure, the initial discharge induction coil 120 optimized for initial discharge and the main discharge induction coil module 103 for suppressing thermal damage of the dielectric discharge tube 140 and increasing the discharge efficiency are used to address the above issues. In an initial discharging step, RF power is introduced into the initial discharging induction coil 120 to from a transition from a capacitively coupled mode to an inductively coupled mode. The main discharge induction coil module 103 may directly generate plasma in the inductively coupled mode without entering the capacitively coupled mode using a large amount of charged particles generated by the initial discharge induction coil 120.

The main discharge induction coil module 103 has electrical characteristics and discharge characteristics different from those of the initial discharge induction coil module 102. The main discharge induction coil module 103 includes a plurality of unit antennas 132 constituting the main discharge induction coil module. The antennas 132 are disposed on different placement planes to be stacked on each other, and are disposed to surround the dielectric discharge tube 140.

It may be difficult for the main discharge induction coil module 103 to operate solely without the initial discharge induction coil. However, after the initial discharge induction coil transitions to the inductively coupled mode, second current Ib flows to the main discharge induction coil module 103 at the same time as the first current Ia flowing through the initial discharge induction coil 120 is removed. The main discharge induction coil module 103 may perform stable discharge in the inductively coupled mode immediately without entering the capacitively coupled mode. Due to voltage division, a second potential difference Vb applied to each of the unit antennas 132 is less than the potential difference Va applied to both ends of the initial discharge induction coil 120. The sum Lb of inductances of the unit antennas 132 is larger than the inductance La of the initial discharge induction coil 120. Therefore, intensity of the induced electric field E_b_ind is high and a potential difference of the plasma sheath is small, so that thermal breakage of the dielectric discharge tube 140 is suppressed and discharge efficiency is increased.

The main discharge induction coil module 103 includes a plurality of unit antennas 132 disposed to be spaced apart from the initial discharge induction coil, respectively disposed on placement planes perpendicular to a central axis of the dielectric discharge tube 140, and connected to each other in series; a first main capacitor 133a and a second main capacitor 133b, respectively disposed on both ends of the unit antennas 132; and auxiliary capacitors 134 connected between the unit antennas 132 in series. The main discharge induction coil module 103 has a second resonant frequency fb and performs voltage division in proportion to the number of the unit antennas 132. Thus, thermal damage to the dielectric discharge tube 140 is suppressed and discharge efficiency is increased.

The RF power supply 150 may change a driving frequency and may selectively supply RF power to the initial discharge induction coil module 102 and the main discharge induction coil module 103 connected to each other in parallel. The RF power supply 150 mainly supplies power to the initial discharge induction coil module 102 at the first resonant frequency fa. On the other hand, the RF power supply 150 mainly supplies power to the main discharge induction coil module 103 at the second resonance frequency fb.

The dielectric discharge tube 140 may be a cylindrical dielectric discharge tube. Specifically, a material of the dielectric discharge tube 140 may be ceramic, sapphire, or quartz. The ceramic may be alumina or AlN. An external diameter of the dielectric discharge tube 140 may be several centimeters to tens of centimeters. An internal diameter of the dielectric discharge tube 140 may be several millimeters to tens of millimeters smaller than the external diameter thereof. A length of the dielectric discharge tube 140 may be several centimeters to several meters. Both ends of the dielectric discharge tube 140 may be respectively coupled to an upper flange 142 and a lower flange 144 to be sealed. The lower flange 144 may receive an exhaust gas of the substrate processing apparatus 10 as a process gas.

Referring to FIG. 9, the initial discharge induction coil 120 may significantly decrease the number of turns per unit length in a length direction of the dielectric discharge tube 120. The initial discharge induction coil 120 may be a solenoid coil having a multilayer structure. Specifically, the initial discharge induction coil 120 has a solenoid shape and may be wound in multiple layers. The initial discharge induction coil 120 may have a triple-layer structure including an internal solenoid coil 120a, an intermediate solenoid coil 120b, and an external solenoid coil 120c. The internal solenoid coil 120a may be four turns surrounding the dielectric discharge tube 120. The intermediate solenoid coil 120b may be four turns surrounding the internal solenoid coil 120a. The external solenoid coil 120c may be three turns surrounding the intermediate solenoid coil 120b. The initial discharge induction coil 120 may be wound to constructively interfere with a magnetic field therein. For example, the inductance La of the initial discharge induction coil 120 may be 8 uH. The initial discharge induction coil 120 may include a copper pipe, and a coolant may flow inside the initial discharge induction coil. A cross section of a pipe, constituting the initial discharge induction coil, may have a circular shape.

The initial discharge capacitors 122a and 122b may be connected to at least one of both ends of the initial discharge induction coil. The initial discharge capacitors 122a and 122b and the initial discharge induction coil 120 may be connected in series to provide the first resonant frequency fa. Capacitance Ca of the first initial discharge capacitor 122a may be the same as capacitance Ca of the second initial discharge capacitor 122b.

The first resonant frequency fa may be 3.3 MHz. The first resonance frequency fa may be defined by equivalent capacitance C'a of the initial discharge capacitors 122a and 122b and inductance La of the initial discharge induction coil 120. The initial discharge capacitors 122a and 122b may be disposed on one of both ends of the initial discharge induction coil.

The DC power supply 112 may generate a high-voltage DC pulse. The high-voltage DC pulse may be a negative DC high voltage and a positive DC high voltage. The DC power supply 112 may generate a high-voltage pulse of several tens of kilohertz (kHz). The negative DC high voltage may be negative tens of kilovolts (kV), and the positive DC high voltage may be positive tens of kV.

A pair of electrodes 114 and 116 may include a first electrode 114 and a second electrode 116, respectively disposed above and below the initial discharge induction coil 120. The first electrode 114 may be charged with a positive DC high voltage and may be in the form of a rectangular plate adhering and attached to the dielectric discharge tube 140.

The first electrode 114 is disposed to be in contact with an external sidewall of the dielectric discharge tube 140 above the initial discharge induction coil 120 and receives the positive DC high voltage. The first electrode 114 may have a rectangular shape.

The second electrode 116 is disposed to be in contact with an external sidewall of the dielectric discharge tube 120 below the initial discharge induction coil 120 and receives the negative DC high voltage. The second electrode 116 may have a "C" shape to surround the dielectric discharge tube 140. The second electrode 116 may have a larger area than the first electrode to generate electrons. The second electrode 116 may be a band-shaped conductor disposed to surround the dielectric discharge tube 140. The second electrode 116 may be heated by an induction electric field E_a_ind generated by the initial discharge induction coil or an induction electric field E_b_ind generated by the unit antennas. Therefore, the second electrode 116 may have a "C" shape without forming a perfect loop such that eddy current, generated by the induced electric fields E_a_ind and E_b_ind, does not flow. The second electrode may be charged with a negative DC high voltage and may be in the form of a band adhering and attached to the dielectric discharge tube 140. In addition, the second electrode 116 may be formed to be serpentine such that the induced electric field in an azimuthal direction does not flow, or may include a plurality of slits extending in a direction of a central axis of a cylinder.

Voltages, applied to the first electrode 114 and the second electrode 116, may have opposite signs and may have the same absolute value. The DC power supply 112, applying a DC high voltage to the first electrode 114 and the second electrode 116, may apply a level of 30 kV at atmospheric pressure. In this case, a vertical streamer is generated in a vertical direction in which the first electrode 114 and the second electrode 116 are connected (the direction of the central axis of the dielectric discharge tube 140), and a C-shaped streamer is generated on the second electrode 116. When the second electrode 116 forms a perfect loop, first current flowing through the initial discharge induction coil 120 may generate eddy current in the second electrode 116 and may heat the second electrode 116. Therefore, the second electrode 116 may be cut while securing a sufficient area to suppress the eddy current or may have a slit in a vertical direction.

A gap between the first electrode 114 and the initial discharge induction coil 120 or a gap between the second electrode 116 and the initial discharge induction coil 120 may be large enough to suppress parasitic discharge, caused by a high voltage at atmospheric pressure, and induction heating caused by an inducted magnetic field. Specifically, the gap between the first electrode 114 and the initial discharge induction coil 120 or the gap between the second electrode 116 and the initial discharge induction coil 120 may be several centimeters (cm) or more, in detail, 1 cm or more.

The RF power supply 150 may output RF power. The RF power supply 150 may convert commercial AC power into RF power and transmit the RF power to a load. For example, the RF power may have a frequency of several hundreds of KHz to several tens of MHz and a power of several kW or more. The RF power supply 150 may include a rectifier, an inverter, and a controller. The rectifier may convert commercial AC power into DC power. The inverter may receive the DC power and convert the received DC power into RF power in response to switching signals of the controller. The controller may control the switching signals to control a driving frequency and power. The RF power may perform impedance matching at a first resonant frequency fa or a second resonant frequency fb by changing a driving frequency. The first resonant frequency fa and the second resonant frequency fb may be spaced apart from each other by 0.2 MHz or more. When the first resonant frequency fa is within 0.2 MHz at the second resonant frequency fb, impedances in two different directions are similar to each other, and thus, power switching may be unstable. The first resonant frequency fa may be higher than the second resonant frequency fb.

A first detection sensor 152 may detect a current or a voltage flowing through the initial discharge induction coil 120. The second detection sensor 154 may detect a current or a voltage flowing through the main discharge induction coil module 103. The RF power supply 150 may detect a transition from a capacitively coupled mode to an inductively coupled mode using an output of the first detection sensor 152 and may change a driving frequency from the first resonant frequency to the second resonant frequency.

Referring to FIG. 6, a main discharge induction coil module 103 includes a plurality of unit antennas, auxiliary capacitors 134 disposed between the plurality of unit antennas 132, and a first main capacitor 133a and a second main capacitor 133b, respectively disposed at both ends of the antennas. A cross section of a coil, constituting the unit antenna 132, may have a rectangular shape. The unit antennas 132 may be disposed clockwise at intervals of 90 degrees. Therefore, terminals electrically connecting the unit antennas 132 may not interfere with each other.

Referring to FIGS. 7 and 8, a rectangular cross section may increase a contact area with the dielectric discharge tube 140 such that heat exchange efficiency may be improved to cool the dielectric discharge tube 140. When main discharge is performed, plasma may transfer energy to the dielectric discharge tube 140 to heat the dielectric discharge tube 140 to hundreds of degrees Celsius or more. An increase in temperature of the dielectric discharge tube 140 may cause modification or damage of a material. A coolant flows inwardly of the unit antenna 132 to cool the unit antenna 132. Since a coil having a circular cross section is in line contact with the dielectric discharge tube 140, it may be difficult to efficiently cool the dielectric discharge tube 140. A coil having a rectangular cross section increases in cooling efficiency through surface contact with the dielectric discharge tube 140. To stably maintain contact with an internal coil of the unit antenna 132 and the dielectric discharge tube 140, the internal coil is tightened to decrease in a radius. Experimentally, in the case of a circular cross-section coil, breakage of the dielectric discharge tube 140 was found at RF power of 5 kW or more. However, in the case of a rectangular cross-section coil, no breakage of the dielectric discharge tube 140 was found even at RF power of 8 kW.

The unit antenna 132 may include a first antenna 132a disposed to be in contact with the dielectric discharge tube 140 on a placement plane perpendicular to the central axis of the dielectric discharge tube 140 and forming a loop; a second antenna 132b continuously connected to the first antenna 132a, disposed to surround the first antenna 132a, and forming a loop; and a third antenna 132c continuously connected to the second antenna 132b, disposed to surround the second antenna 132b, and forming a loop.

The unit antenna 132 has a rectangular cross section, and the first antenna 132a adheres to the dielectric discharge tube 140 to cool the dielectric discharge tube 140. The first antenna 132a and the second antenna 132b may be connected by the U-shaped first connector 32a. The second antenna 132b and the third antenna 132c may be connected by the U-shaped second connector 32b.

A clamp 35 may be disposed to allow both ends of the first antenna 132a to adhere to each other such that the first antenna 132a is brought into contact with the dielectric discharge tube 140. The clamp 35 may be a cable tie.

The unit antenna 132 may include a plurality of turns disposed on the same placement plane, and an insulating spacer 36 may insulate the plurality of turns and may have a " ⊥⊥ " shape. The turns, each constituting the unit antenna 132, may be electrically insulated by an insulating spacer 36 and may be maintained at regular intervals. The insulating spacer 36 may insulate adjacent unit antennas 132. The insulating spacer may have a " ⊥⊥ " shape, and the second antenna 132b may be inserted into a recessed portion 36a.

At least a portion of the first antenna 132a may be molded using a ceramic paste. A ceramic mold 37, surrounding at least a portion of the first antenna 132a, may be in thermal contact with the dielectric discharge tube 140. Therefore, when a coolant flows through the unit antenna 132, the cooled unit antenna 132 may cool the ceramic mold 37 and the ceramic mold 37 may indirectly cool the dielectric discharge tube 140.

Capacitance 2C1 of the first main capacitor 133a is the same as capacitance of the second main capacitor 133b. The capacitance 2C1 of the first main capacitor 133a may be twice as high as capacitance C1 of the auxiliary capacitor 134.

The second resonant frequency fb may be given by the sum Lb of inductances of the plurality of unit antennas 132a and equivalent capacitance Cb of the capacitors 133a, 133b, and 134.

A first voltage drop Va, induced to the initial discharge induction coil 120 at the first resonant frequency fa, may be greater than a second voltage drop Vb induced to the unit antenna 132a at the second resonant frequency fb. It may be greater than. The second voltage drop Vb may be expressed as a product of the second resonant frequency fb, second current Ib, and the inductance L1 of the unit antenna 132a. The first voltage drop Va may be expressed as a product of the first resonant frequency fa, first current Ia, and the inductance La of the initial discharge induction coil.

The sum Lb of the inductances of the plurality of unit antennas may be greater than the inductance La of the initial discharge induction coil.

Figure 10:
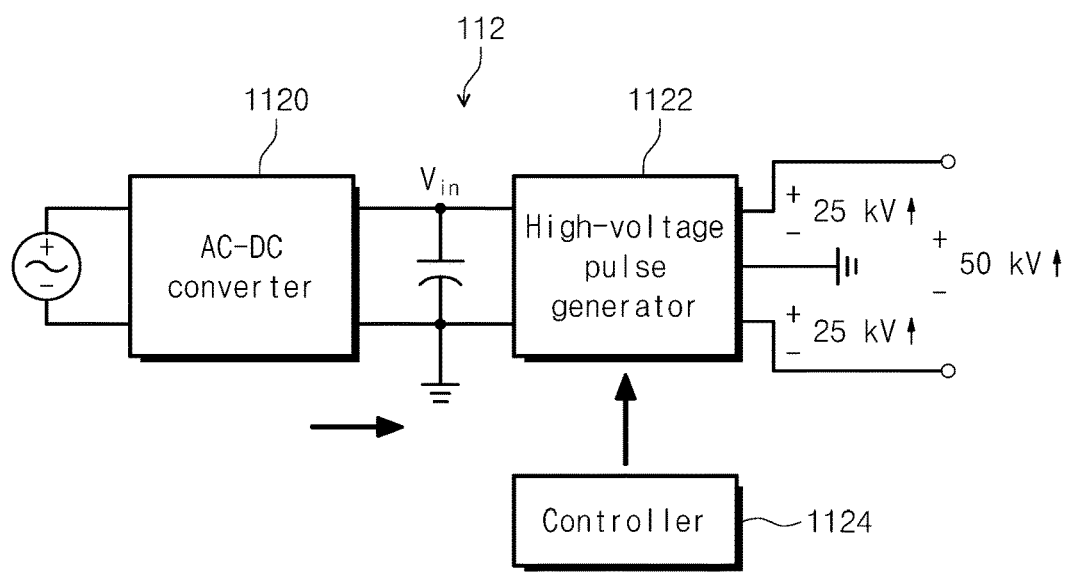
FIG. 10 is a circuit diagram of a DC power supply according to another example embodiment of the present disclosure.

FIG. 10 is a circuit diagram of a DC power supply according to another example embodiment of the present disclosure.

Figure 11:
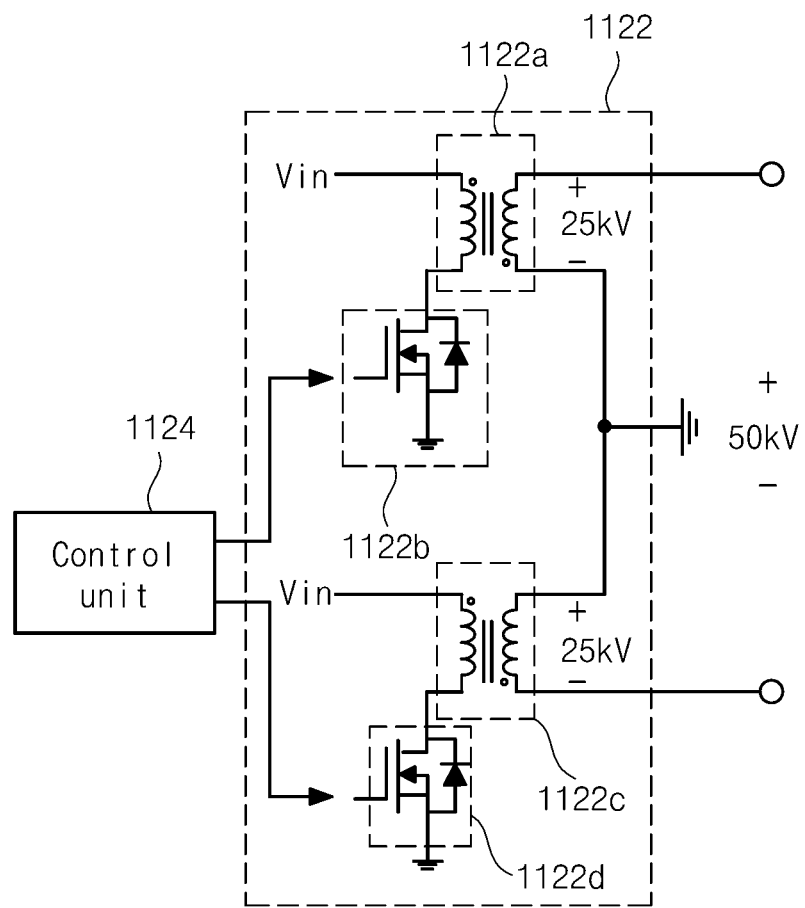
FIG. 11 is a circuit diagram illustrating a high-voltage pulse generator in FIG.

FIG. 11 is a circuit diagram illustrating a high-voltage pulse generator in FIG. 10.

Referring to FIGS. 10 and 11, the DC power supply 112 may include an AC-DC converter 1120 converting commercial power into a DC voltage Vin; a high-voltage pulse generator 1122 receiving the DC voltage Vin to generate a positive DC high-voltage pulse and a negative DC high-voltage pulse; and a controller 1124 controlling the high-voltage pulse generator.

The high-voltage pulse generator 1122 may include a first transformer 1222a including a primary coil receiving the DC voltage of the AC-DC converter and a secondary coil generating a positive DC high-voltage pulse; a first power transistor 1222b connected to the primary coil of the first transformer 1222a; a second transformer 1222c including a primary coil receiving the DC voltage of the AC-DC converter and a secondary coil generating a negative DC high-voltage pulse; and a second power transistor 1222d connected to the primary coil of the second transformer 1222c. The controller 1124 may control gates of the first power transistor 1222b and the second power transistor 1222d. One end of the secondary coil of the first transformer 1222a outputs a positive DC high-voltage pulse, and the other end of the secondary coil of the first transformer 1222a is grounded. One end of the secondary coil of the second transformer 1222c outputs a negative DC high-voltage pulse, and the other end of the secondary coil of the second transformer 1222c is grounded.

The DC voltage Vin may be a DC voltage of 12V to 24V. The controller 1124 controls an ON time and a repetition frequency of the first power transistor 1222b and the second power transistor 1122d in synchronization with each other. The DC high-voltage pulse may be several tens of kV, and the repetition frequency may be several tens of kHz.

Figure 12:
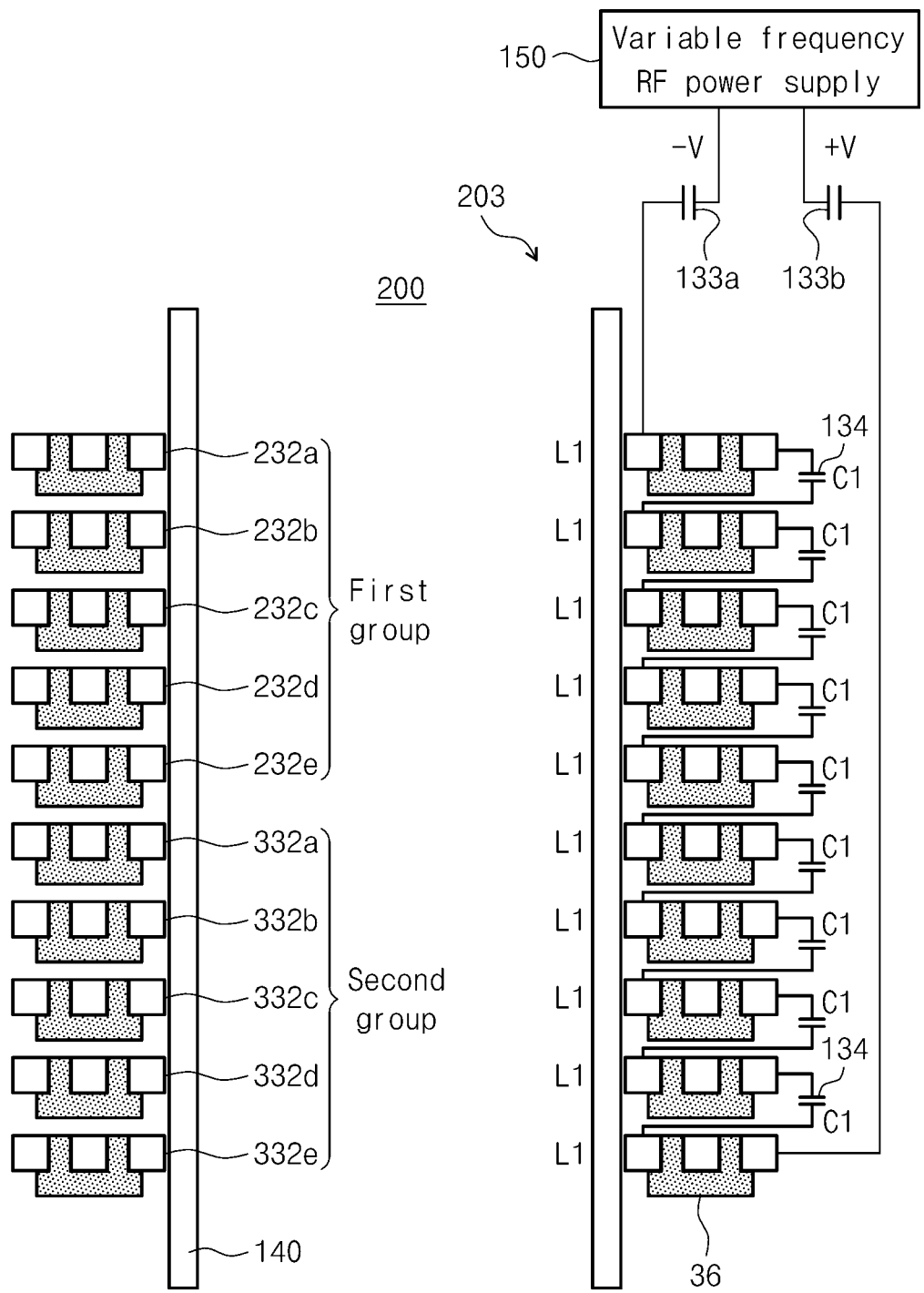
FIG. 12 is a cross-sectional view illustrating a main discharge induction coil module of an atmospheric-pressure plasma generating apparatus according to another example embodiment of the present disclosure.

FIG. 12 is a cross-sectional view illustrating a main discharge induction coil module of an atmospheric-pressure plasma generating apparatus according to another example embodiment of the present disclosure.

Figure 13:
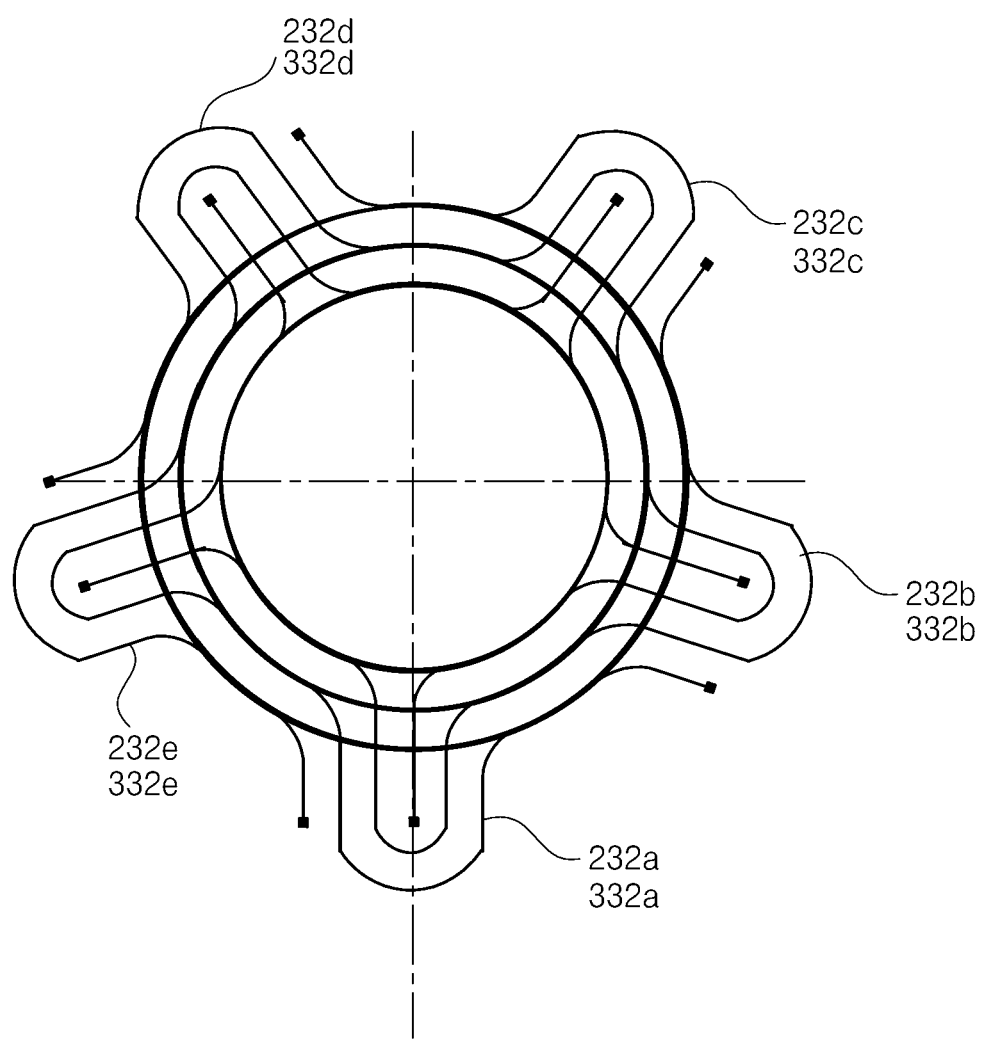
FIG. 13 is a plan view illustrating a disposition relationship of unit antennas of the main discharge induction coil module in FIG. 12.

FIG. 13 is a plan view illustrating a disposition relationship of unit antennas of the main discharge induction coil module in FIG. 12.

Figure 14:
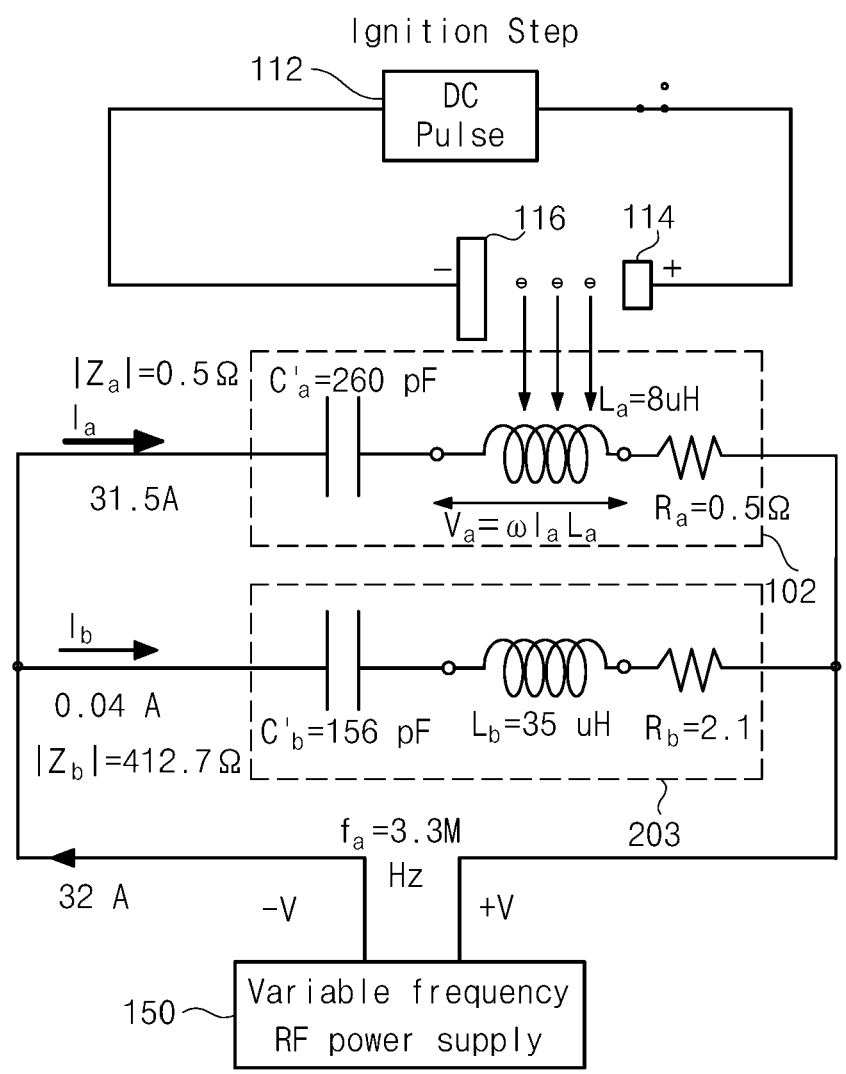
FIG. 14 is an equivalent circuit diagram illustrating an initial discharge mode of the atmospheric-pressure plasma generating apparatus in FIG. 12.

FIG. 14 is an equivalent circuit diagram illustrating an initial discharge mode of the atmospheric-pressure plasma generating apparatus in FIG. 12.

Figure 15:
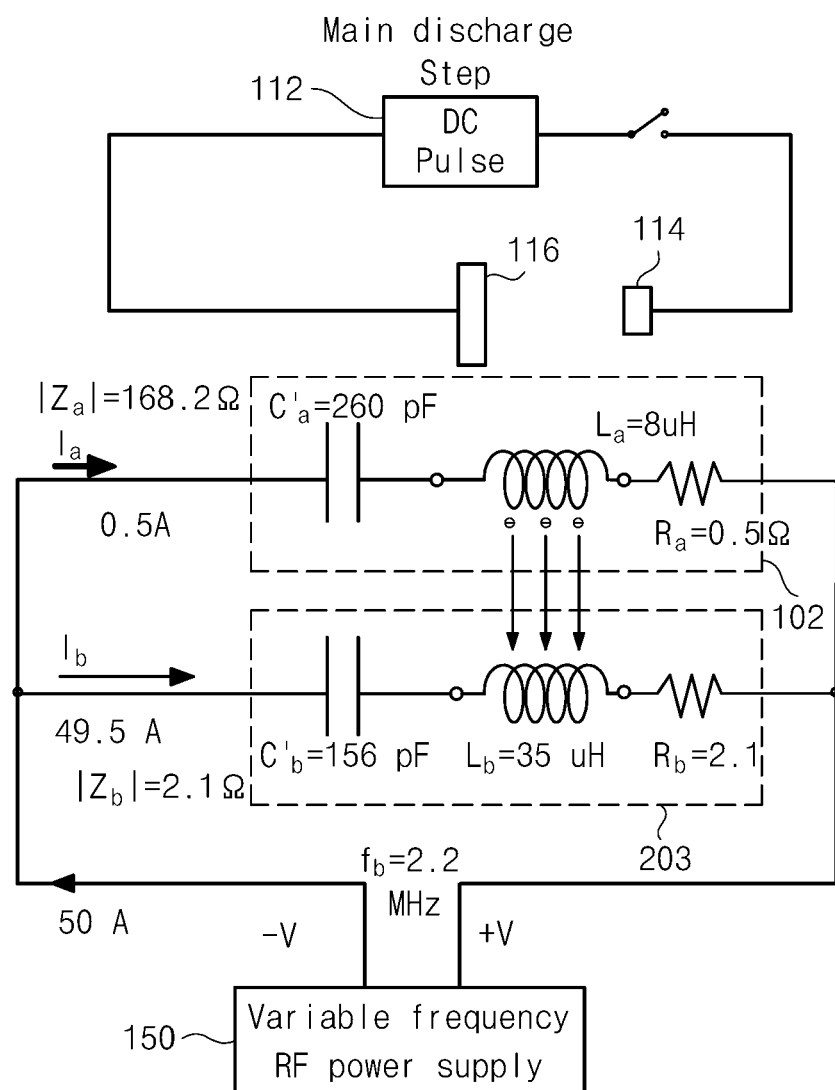
FIG. 15 is an equivalent circuit diagram illustrating a main discharge mode of the atmospheric-pressure plasma generating apparatus in FIG. 12.

FIG. 15 is an equivalent circuit diagram illustrating a main discharge mode of the atmospheric-pressure plasma generating apparatus in FIG. 12.

Figure 16:
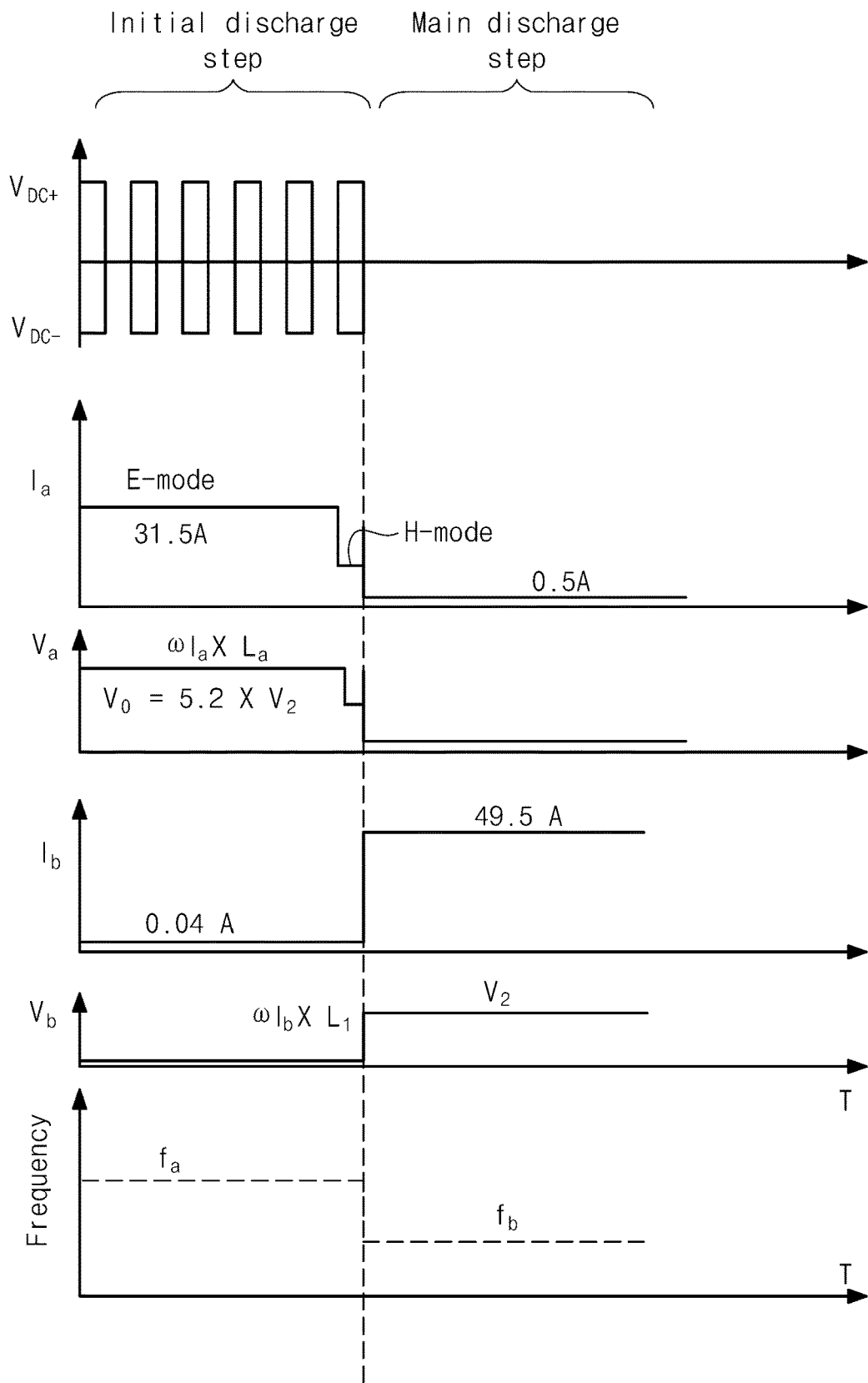
FIG. 16 is a timing diagram illustrating an initial discharge mode and a main discharge mode of the atmospheric-pressure plasma generating apparatus in FIG. 12.

FIG. 16 is a timing diagram illustrating an initial discharge mode and a main discharge mode of the atmospheric-pressure plasma generating apparatus in FIG. 12.

Referring to FIGS. 12 to 16, the atmospheric-pressure plasma generating apparatus 200 may include a dielectric discharge tube 140; an initial discharge induction coil module 102 including an initial discharge induction coil 120 surrounding the dielectric cylindrical tube 140, having a plurality of turns, and generating initial discharge and initial discharge capacitors 122a and 122b connected to the initial discharge induction coil 120 in series to provide a first resonant frequency fa; a first electrode 114 and a second electrode 116, respectively disposed above and below the initial discharge induction coil 120 to provide an initial discharge seed; a DC power supply 112 applying a DC high voltage between the first electrode 114 and the second electrode 116; a main discharge induction coil module 203 having a second resonant frequency fb and receiving the initial discharge, generated by the initial discharge induction coil module 102, to generate main inductively coupled plasma; and an RF power supply 150 providing RF power to the initial discharge induction coil module 102 and the main discharge induction coil module 203 connected to each other in parallel and changing a driving frequency.

The main discharge induction coil module 203 may include A plurality of unit antennas 232a to 232d and 332a to 332e disposed to be spaced apart from the initial discharge induction coil 120, respectively disposed on a plurality of placement planes perpendicular to a central axis of the dielectric discharge tube 140, and connected to each other in series; a first main capacitor 133a and a second main capacitor 133b, respectively disposed on both ends of the unit antennas 232a to 232d and 332a to 332e; and auxiliary capacitors 134 connected between the unit antennas 232a to 232d and 332a to 332e in series, respectively.

The RF power supply 150 induces initial discharge to the initial discharge induction coil 120 at the first resonant frequency fa with the help of the DC high voltage. The RF power supply 150 changes the driving frequency from the first resonant frequency fa to a second resonant frequency fb to perform main discharge.

The unit antennas 232a to 232d and 332a to 332e are disposed on different placement planes and may be ten. The unit antennas 232a to 232d and 332a to 332e are divided into a first group 232a to 232d, including five unit antennas, and a second group 332a to 332e including the other five unit antennas. The unit antennas, constituting the first group 232a to 232d, may be disposed at intervals of 72 degrees in an azimuthal direction. The unit antennas, constituting the second groups 332a to 332e, may be disposed at intervals of 72 degrees in the azimuthal direction. Therefore, the unit antennas may not interfere with each other to provide electrical connection between adjacent unit antennas.

Specifically, equivalent capacitance C'a of the initial discharge capacitors 122a and 122b may be 260 pF, inductance La of the initial discharge induction coil may be 8 uH, parasitic resistance of the initial discharge induction coil Ra may be 0.5 ohm. The first resonant frequency fa may be 3.3 MHz.

Inductance of the unit antenna may be 3.5 uH, and the sum of inductances of the unit antenna may be 35 uH. Equivalent capacitance C'b of the capacitors 133a, 133b, and 134, constituting the main discharge induction coil module 203, may be 156 pF. Parasitic resistance Rb of the main discharge induction coil module 203 may be 2.1 ohms. The second resonant frequency fb may be 2.2 MHz.

Referring to FIG. 14, in the initial discharging operation, the driving frequency may be a first resonant frequency of 3.3 MHz. In this case, first current Ia flowing through the initial discharge induction coil module 102 is 31.5 A, and second current Ib flowing through the main discharge induction coil module 203 is 0.04 A. Therefore, a current ratio (a ratio of Ia to Ib) or an impedance ratio may be 800 to 1. For example, in the initial discharging operation, all currents may flow to the initial discharging induction coil module 102 and may transition from a capacitively coupled mode to an inductively coupled mode. When the first current Ia, flowing through the initial discharge induction coil module 102, or a voltage is sensed to transition to the inductively coupled mode, the RF power supply changes the driving frequency into the second resonant frequency fb according to a control signal.

Referring to FIG. 15, in the main discharge operation, the driving frequency may be 2.2 MHz, a second resonant frequency. In this case, the first current Ia flowing through the initial discharge induction coil module 102 is 0.5 A, and the second current Ib flowing through the main discharge induction coil module 203 is 49.5 A. Therefore, a current ratio (a ratio of Ia to Ib) or an impedance ratio may be 1 to 100. For example, in the main discharge operation, all current flows to the main discharge induction coil module 203. Thus, stable plasma is maintained.

In addition, in the main discharging operation, a maximum value V2 of a potential difference Vb applied to both ends of the unit antenna is about 5.2 times smaller than a maximum value Vo of a potential difference Va applied to both ends of the initial discharging induction coil. Accordingly, thermal damage of the dielectric discharge tube 140 may be eliminated during main discharge.

Figure 17:
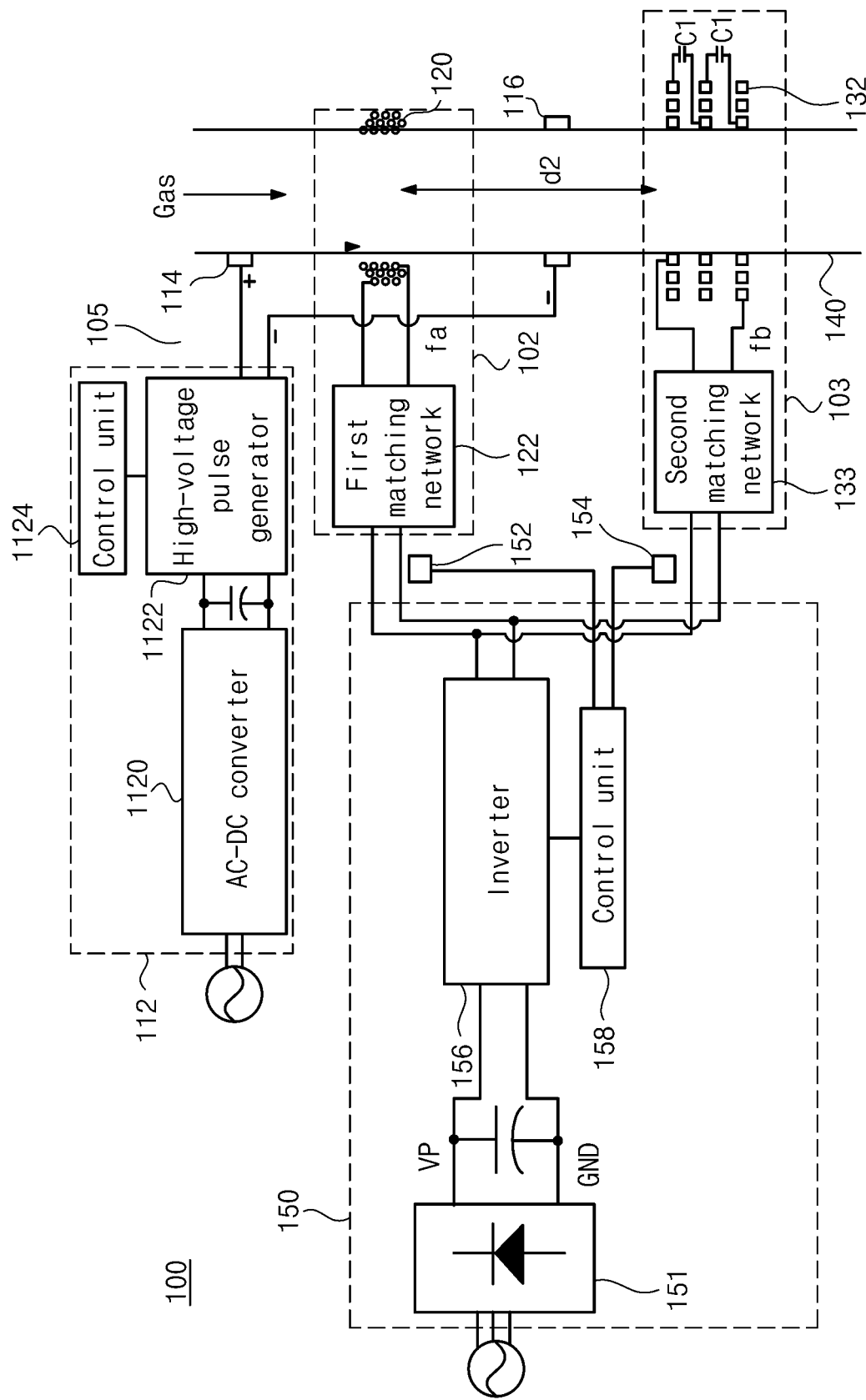
FIG. 17 is a conceptual diagram illustrating a plasma generating apparatus according to FIG. 2A.

FIG. 17 is a conceptual diagram illustrating a plasma generating apparatus according to FIG. 2A.

Referring to FIG. 17, the plasma generating apparatus 100 may include a dielectric discharge tube 140; a seed charge generator 105 generating seed charges in the dielectric discharge tube 140; an initial discharge induction coil module 102 including an initial discharge induction coil 120 surrounding the dielectric cylindrical tube 140 and receiving the seed charges to generate initial discharge and a first impedance matching network 122 connected to the initial discharge induction coil 120 to provide a first resonant frequency; a main discharge induction coil module 103 including a plurality of unit antennas 132 disposed to be spaced apart from the initial discharge induction coil 120, surrounding the dielectric cylindrical tube 140, and receiving the initial discharge to generate a main inductively coupled plasma and a second impedance matching network 133 connected to the plurality of unit antennas 132 to provide a second resonant frequency; and an RF power supply 150 supplying power to the initial discharge induction coil module 102 and the main discharge induction coil module 103.

The seed charge generator 105 may include a first electrode 114, a second electrode 116, and a DC power supply applying a DC high voltage between the first electrode 114 and the second electrode 116.

The DC power supply 112 may include an AC-DC converter 1120 converting commercial power into a DC voltage Vin; a high-voltage pulse generator 1122 receiving the DC voltage Vin to generate a positive DC high-voltage pulse and a negative DC high-voltage pulse; and a controller 1124 controlling the high-voltage pulse generator 1122.

The RF power supply 150 may include a rectifier 151, an inverter 156, and a control unit 158.

Referring to FIGS. 2A and 17, the initial discharge capacitors 122a and 122b may be respectively disposed on both ends of the initial discharge induction coil 120 to provide impedance matching for a load while constituting a resonance circuit, and thus, may perform impedance matching. For example, the first impedance matching network 122 may include the initial discharge capacitors 122a and 122b.

In addition, the first main capacitor 133a and the second main capacitor 133b may be respectively disposed on both ends of the unit antennas, connected in series to perform main discharge, to provide impedance matching for a load I while constituting a resonance circuit, and thus, may perform impedance matching. For example, the second impedance matching network 133 may include a first main capacitor 133a and a second main capacitor 133b.

A distance d2 between the initial discharge induction coil 120 and the unit antenna 132 of the main coil induction coil module may be long enough to protect the second electrode 116 causing seed charges to be generated by a DC high voltage. To form a compact structure, the second electrode 116 disposed between the initial discharge induction coil 120 and the unit antenna 132 of the main coil induction coil module 103 needs to be removed. The seed charge generator 105 may generate seed charges in various manners to stably generate the seed charges.

As an example, the seed charge generator 105 may include a pair of electrodes having a DC high voltage difference. One electrode may be disposed on an external sidewall of the dielectric discharge tube 140, and the other electrode may be disposed on a central axis of the dielectric discharge tube 140. Therefore, a strong electric field may be applied by a DC high-voltage pulse in a radial direction of the dielectric discharge tube 140 to generate seed charges. When the second electrode 116 disposed between the initial discharge induction coil 120 and the unit antenna 132 of the main coil induction coil module is removed, a plasma generating apparatus may have a compact structure. In order to stably generate the seed charges, a plurality of electrodes may be disposed outside and/or inside of the dielectric discharge tube 140. Specifically, the first electrode 114 may receive a DC high voltage and may be disposed to be in contact with the external sidewall of the dielectric discharge tube 140, and the second electrode may be grounded to be disposed inside of the dielectric discharge tube 140. The second electrode may be grounded and may perform a nozzle function to discharge an ignition gas and/or a process gas. Accordingly, an electric field may be generated in the radial direction of the dielectric discharge tube 140 by the DC high-voltage pulse, and the electric field may generate seed charges to induce initial discharge of the initial discharge induction coil module.

According to a modified embodiment, the seed charge generator 105 may include a waveguide receiving a super-high frequency and radiating the super-high frequency through a slit. The super-high frequency, radiated through the slit of the waveguide, may be transferred to the inside of the dielectric discharge tube 140 to generate seed charges at an atmospheric pressure.

Figure 18:
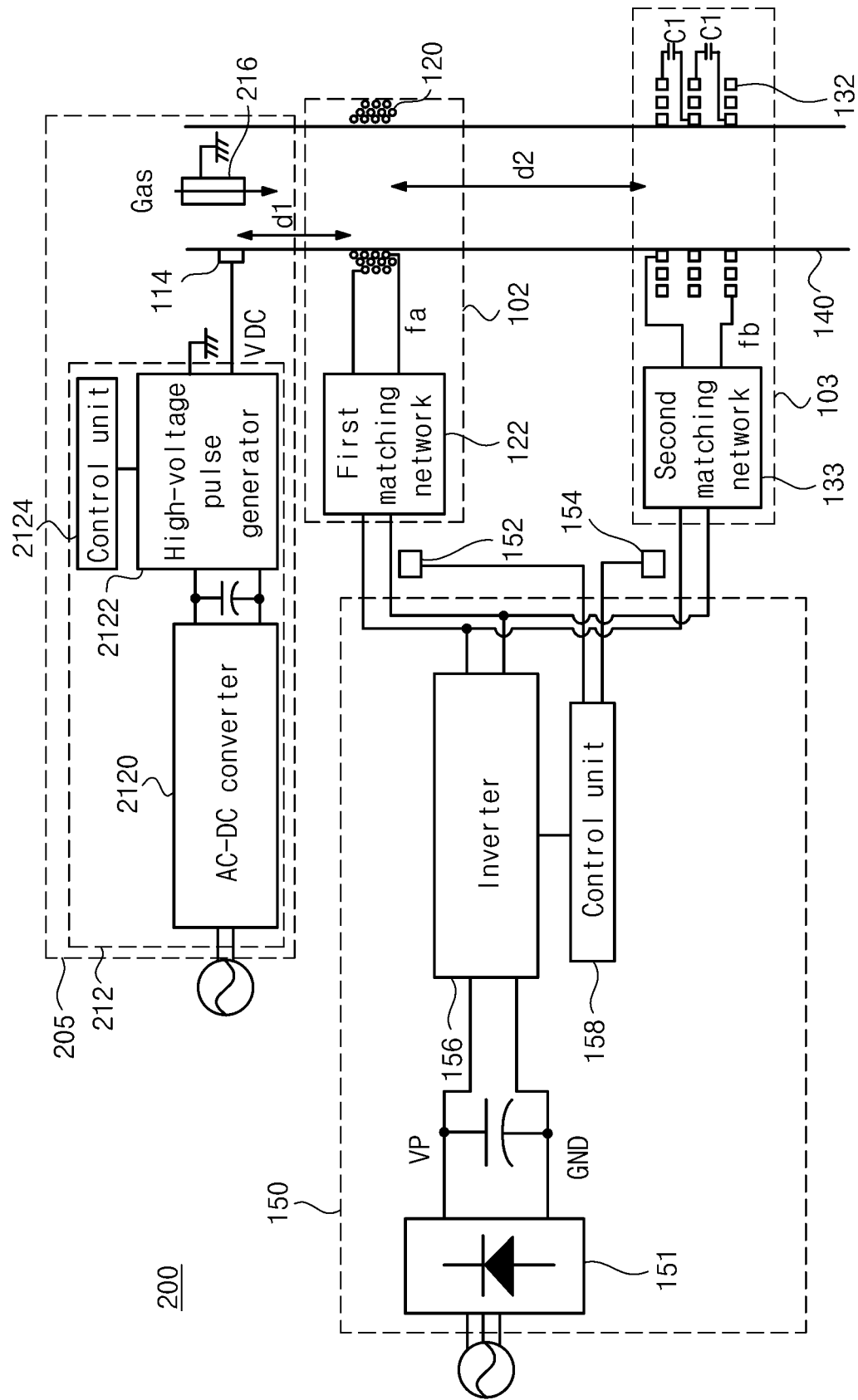
FIG. 18 is a conceptual diagram illustrating a plasma generating apparatus according to another example embodiment of the present disclosure.

FIG. 18 is a conceptual diagram illustrating a plasma generating apparatus according to another example embodiment of the present disclosure.

Referring to FIG. 18, a plasma generating apparatus 200 may include a dielectric discharge tube 140; a seed charge generator 205 generating seed charges in the dielectric discharge tube 140; an initial discharge induction coil module 102 including an initial discharge induction coil 120 surrounding the dielectric discharge tube 140 and receiving the seed charges to generate initial discharge and a first impedance matching network 122 connected to the initial discharge induction coil 120 to provide a first resonant frequency; a main discharge induction coil module 103 including a plurality of unit antennas 132 disposed to spaced apart from the initial discharge induction coil 120, surrounding the dielectric discharge tube 140, and receiving the initial discharge to generate main inductively coupled plasma and a second impedance matching network 133 connected to the unit antennas 132 to provide a second resonant frequency; and an RF power supply 150 supplying power to the initial discharge induction coil module 102 and the main discharge induction coil module 103.

The dielectric discharge tube 140 may be a cylindrical dielectric tube.

The seed charge generator 205 may include a first electrode 114 and a second electrode 216 disposed on the dielectric discharge tube 140 to provide seed charges; and a DC power supply 212 applying a DC high-voltage pulse between the first electrode 114 and the second electrode 216. The first electrode 114 may have a plate or band shape and may be disposed to be bent in contact with an external sidewall of the dielectric discharge tube 140. The second electrode 216 is disposed on a central axis of the dielectric discharge tube 140 and may be electrically grounded. The second electrode 216 may have a cylindrical shape and may additionally perform a nozzle function to inject a gas.

The DC power supply 212 may output a DC high-voltage pulse VDC of several kHz to several tens of kHz. The output DC voltage of the DC power supply 112 may be several kV to several tens of kV. An electric field E_ig may be generated in a radial direction of the dielectric discharge tube 140 by the DC high-voltage pulse VDC, the electric field E_ig may generate seed charges in the state in which an ignition gas is injected, and the seed charges may induce initial discharge of the ignition gas of the initial discharge induction coil module 102. The seed charge generator 105 may include a first electrode 114, a second electrode 116, and a DC power supply 112 applying a DC high voltage between the first electrode 114 and the second electrode 116.

The DC power supply 212 includes an AC-DC converter 2120 converting commercial power into a DC voltage Vin; a high-voltage pulse generator 2122 receiving the DC voltage Vin to generate a positive DC high-voltage pulse and a negative DC high-voltage pulse; and a controller 2124 controlling the high-voltage pulse generator 2122.

As an electrode disposed between the initial discharge induction coil 120 and the unit antenna 132 of the main coil induction coil module is removed, a compact structure may be formed. A distance d2 between the initial discharge induction coil 120 and the unit antenna 132 of the main coil induction coil module may be maintained at 3 cm or less. In addition, a distance d1 between the initial discharge induction coil 120 and the first electrode may be maintained at 3 cm or less.

The initial discharge induction coil module 102 includes the first impedance matching network 122 and the initial discharge induction coil 120. The first impedance matching network 122 may include a pair of initial discharge capacitors 122a and 122b, respectively connected to both ends of the initial discharge induction coil 120. The initial discharge induction coil 120 may be in the form of a solenoid having a multilayer structure to increase inductance. The first resonant frequency fa of the initial discharge induction coil module 102 may range from 4 MHz to 5 MHz, and current of several tens of amperes may flow to the initial discharge induction coil module 102. The initial discharge induction coil 120 generates initial discharge of a gas with the help of the seed charges, and transitions from a capacitively coupled mode (or an E-mode) to an inductively coupled mode (or an H-mode). For example, the initial discharge plasma transitions from a streamer-type capacitively coupled mode to a bulk plasma-type inductively coupled mode in which plasma is entirely generated inside of the dielectric discharge tube 140.

The main discharge induction coil module 103 may include a plurality of unit antennas 132 disposed on a plurality of placement planes perpendicular to a central axis of the dielectric discharge tube and connected to each other in series; auxiliary capacitors 134 connected between adjacent unit antennas 132 in series; and the second impedance matching network 133 connected to the unit antennas 132 connected in series. The main discharge induction coil module 103 may generate main inductively coupled plasma using the initial discharge of the gas.

The second impedance matching network 133 may include a first main capacitor 133a and a second main capacitor 133b. The first main capacitor 133a and the second main capacitor 133b is disposed on both ends of the unit antennas connected in series, respectively.

The main discharge induction coil module 103 has a second resonant frequency fb and includes a second impedance matching network 133 to perform impedance matching with the second resonant frequency fb. The unit antennas 132 may have at least one turn in the same plane. The unit antennas 132 are disposed on different placement planes, and adjacent unit antennas are connected to each other in series through an auxiliary capacitor 134.

The RF power supply 150 may include a rectifier 151 converting commercial AC power into DC power; an inverter 156 receiving the DC power and converting the received DC power into RF power in response to switching signals from the controller 158; and a controller 158 controlling the switching signals to control the driving frequency and power. The RF power supply 150 may operate at the first resonant frequency fa during initial discharge, and may operate at the second resonant frequency fb when main inductively coupled plasma is generated. The RF power supply 150 may be a variable frequency power supply. The RF power supply 150 may change an ignition gas into a process gas to maintain the main inductively coupled plasma when the main inductively coupled plasma is generated.

The rectifier 151 may convert an output of commercial AC power into DC power. The rectifier 151 may supply DC power between a ground node GND and a power supply node VP. A capacitor may be connected between the ground node GND and the power supply node VP to discharge an AC component to the ground node GND.

The inverter 156 may receive a switching signal from the controller 158 to convert DC power into AC power in response to the switching signals. The controller 158 may control a switching signal to adjust the amount of power and a driving frequency provided from an inverter to a load.

In the case of a single RF power supply, the first resonant frequency fa and the second resonant frequency fb should be sufficiently spaced apart from each other by MHz or more. However, it may be difficult for the RF power to provide a stable output for a wide frequency variable range. In particular, the initial discharge is advantageous as a driving frequency is increased and a large amount of current flows. Therefore, both ends of the initial discharge induction coil may be maintained at a high potential difference by high current and high inductance to cause capacitively coupled mode discharge at the first resonant frequency fa. The main inductively coupled plasma requires high power of several kW or more and low voltage drop of a unit antenna. A high-power RF power supply of several kW or more may operate at the second resonant frequency fb lower than the first resonant frequency fa. Accordingly, the first RF power operating at the first resonant frequency and the second RF power operating at the second resonant frequency have different characteristics and may be separated from each other.

Figure 19:
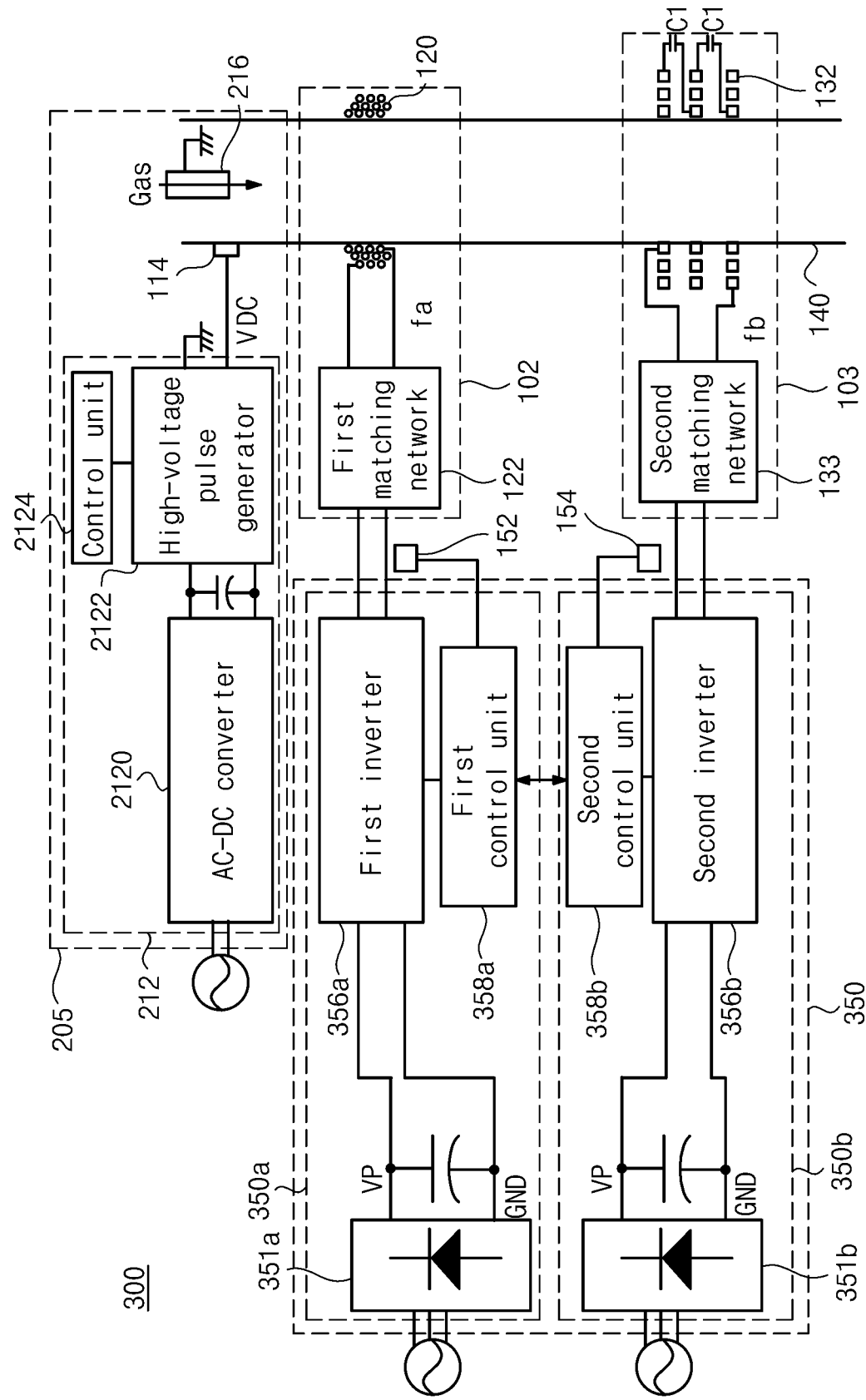
FIG. 19 is a conceptual diagram illustrating a plasma generating apparatus according to another example embodiment of the present disclosure.

FIG. 19 is a conceptual diagram illustrating a plasma generating apparatus according to another example embodiment of the present disclosure.

Figure 20:
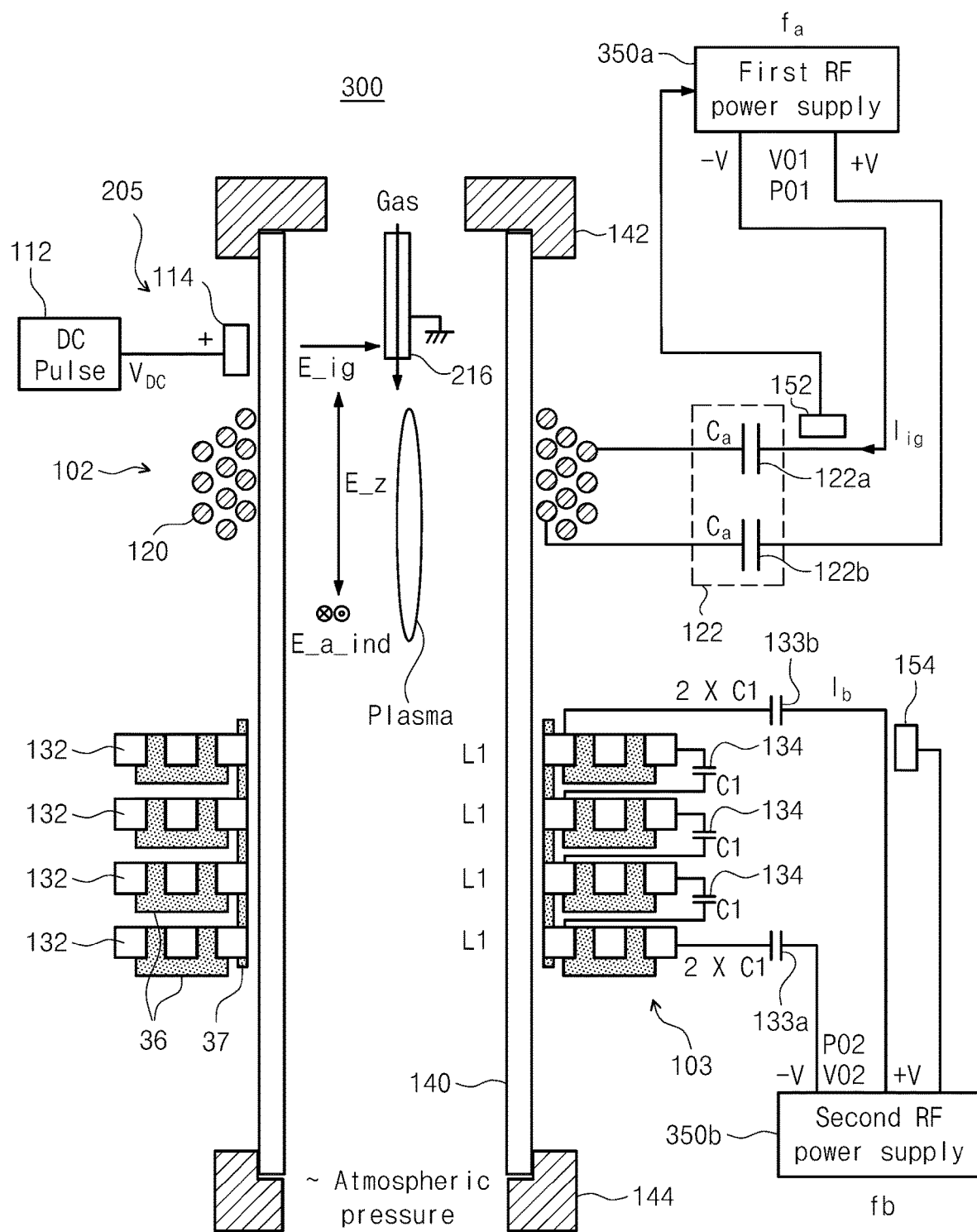
FIG. 20 is a conceptual diagram illustrating discharge of the plasma generating apparatus in FIG. 19.

FIG. 20 is a conceptual diagram illustrating discharge of the plasma generating apparatus in FIG. 19.

Figure 21:
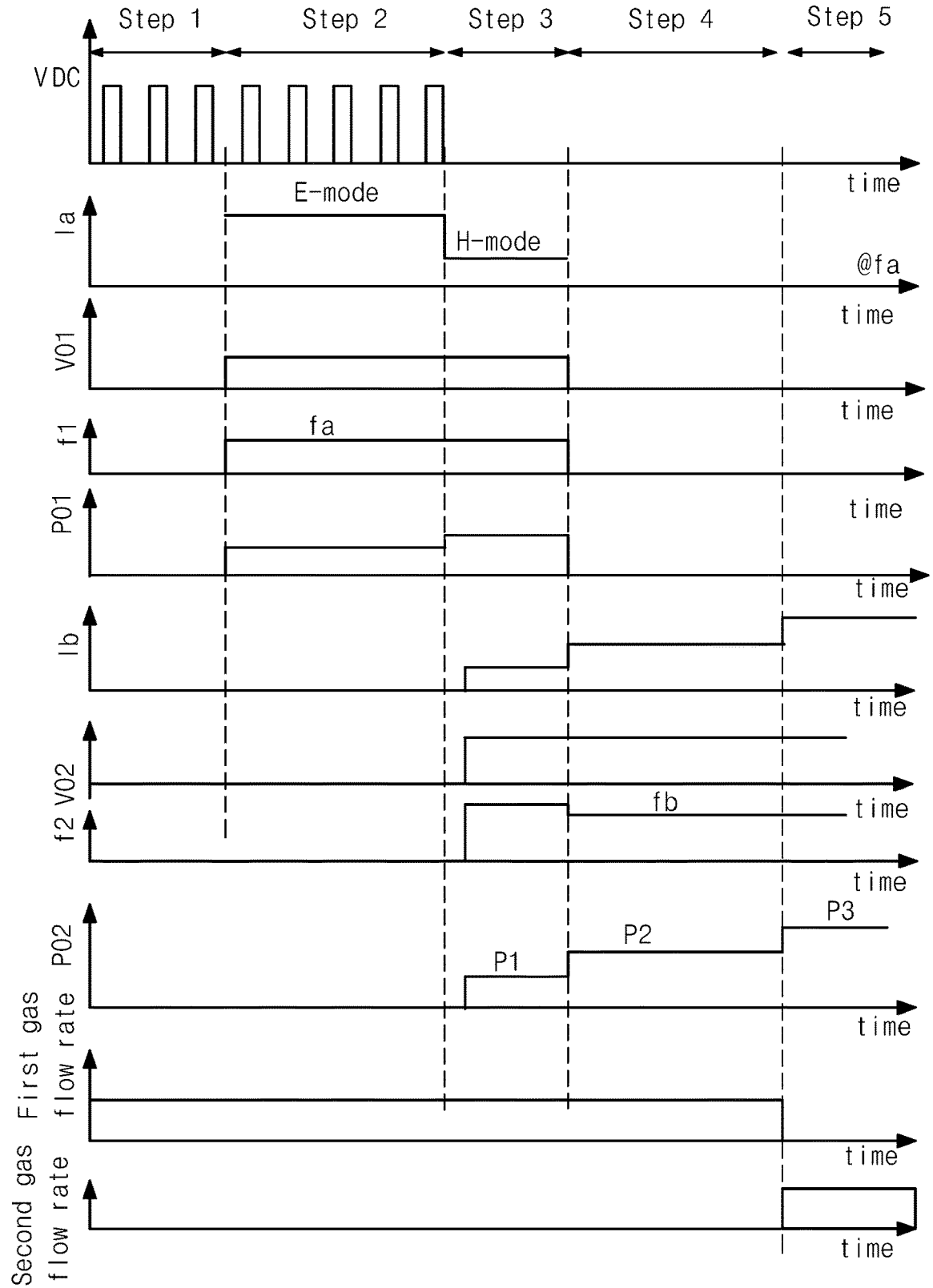
FIG. 21 is a timing diagram of signals in FIG. 19.

FIG. 21 is a timing diagram of signals in FIG. 19.

Figure 22:
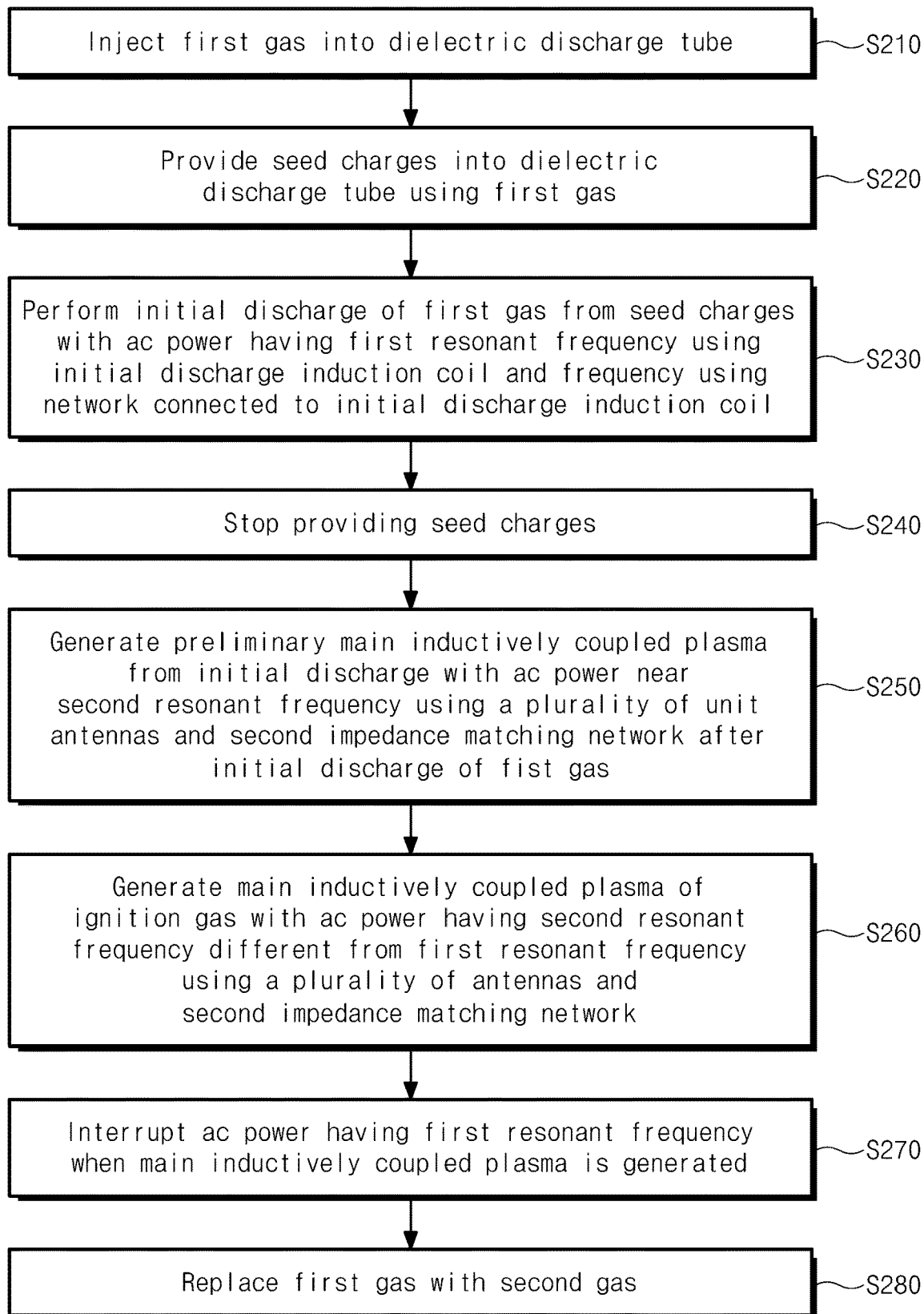
FIG. 22 is a flowchart illustrating a method for operating the plasma generating apparatus in FIG. 19.

FIG. 22 is a flowchart illustrating a method for operating the plasma generating apparatus in FIG. 19.

Referring to FIGS. 19 to 22, a plasma generating apparatus 300 may include a dielectric discharge tube 140; a seed charge generator 205 generating seed charges in the dielectric discharge tube 140; an initial discharge induction coil module 102 including an initial discharge induction coil 120 surrounding the dielectric cylindrical tube 140 and receiving the seed charges to generate an initial discharge and a first impedance matching network 122 connected to the initial discharge induction coil 120 to provide a first resonant frequency; a main discharge induction coil 103 including a plurality of unit antennas 132 disposed to be spaced apart from the initial discharge induction coil 120, surrounding the dielectric discharge tube 140, and receiving the initial discharge to generate main inductively coupled plasma and a second impedance matching network 133 connected to the unit antennas 132 to provide a second resonant frequency; and an RF power supply 350 supplying power to the initial discharge induction coil module 102 and the main discharge induction coil module 103.

The first RF power supply 350a, inducing initial discharge, may be designed to drive high current of tens of amperes or more at a first resonant frequency fa of several MHz or more. The second RF power supply 350b, inducing the main discharge plasma, may be designed to provide high power of several kW or more at a second resonant frequency fb of several MHz or less, in detail, 400 kHz to 4 MHz. Specifically, the first RF power supply 350a may be implemented through a half-bridge inverter circuit, and the second RF power supply 350b may be implemented through a full-bridge inverter circuit. The first RF power supply 350a may be controlled to operate at a fixed first resonant frequency fa. The second RF power supply 350b may control a driving frequency to adjust the amount of power or impedance to operate at a frequency near a second resonant frequency fb.

The RF power supply 350 may include a first RF power supply 350a supplying AC power to the initial discharge induction coil module 102 and operating at the first resonant frequency fa; and a second RF power supply 350b supplying AC power to the main discharge induction coil module 103 and operating at the second resonant frequency fb.

The first RF power supply 350a may include a first rectifier 351a converting AC power to DC power; a first inverter 356a receiving DC power from the first rectifier 351a to supply AC power having the first resonance frequency fa to the initial discharge induction coil module 102; and a first controller 358a controlling an output of the first inverter 356a. The first RF power supply 350a may operate at the first resonant frequency fa.

The second RF power supply 350b may includes: a second rectifier 351b converting AC power into DC power; a second inverter 356b receiving DC power from the second rectifier 351b to supply AC power having the second resonant frequency fb to the main discharge induction coil module 103; and a second controller 358b controlling an output of the second inverter 356b. The second RF power supply 350b may operate, while varying, around the second resonant frequency fb.

A method for operating a plasma generating apparatus according to an example embodiment may include injecting a first gas into a dielectric discharge tube 140 (S210); providing seed charges to an inside of the dielectric discharge tube 140 using the first gas (S220); performing initial discharge of the first gas from the seed charges with AC power of the first resonant frequency using the initial discharge induction coil 120 and the first impedance matching network 122 connected to the initial discharge induction coil 120 (S230); and generate main inductively coupled plasma of the first gas from the initial discharge with AC power of the second resonant frequency fb, different from the first resonant frequency fa, using a plurality of unit antennas 132 and a second impedance matching network 133 (S260).

In the operation of injecting the first gas into the dielectric discharge tube 140 (S210), the first gas may be injected to an upper portion of the dielectric discharge tube 140 through the second electrode 216 performing a nozzle function. A pressure of the dielectric discharge tube 140 may be several Torr or more, in detail, an atmospheric pressure or more. The first gas may be an argon gas, a nitrogen gas, a hydrogen-containing gas, or a carbon dioxide gas, which are advantageous for ignition, or combinations thereof.

In the operation of providing seed charges using the first gas in the dielectric discharge tube 140 (S220), the seed charges may be formed using the seed charge generator 205. For example, the first electrode 114 may be attached to an external sidewall of the dielectric discharge tube 140, and the second electrode 216 may be inserted into a central axis of the dielectric discharge tube 140 to face the first electrode 114. The second electrode 216 may be grounded and may perform a nozzle function to inject a first gas or a second gas. In the state in which the second electrode 216 is grounded, the first electrode 114 may generate seed charges using a DC high-voltage pulse VDC. The second electrode 216 may act as a cathode, and the first electrode 114 may act as an anode. The DC high-voltage pulse VDC may have a pulse frequency of several tens of kHz and a voltage of several tens of kV.

In the operation of performing initial discharge of the first gas from the seed charges (S230), AC power PO1 of the first resonant frequency fa may be supplied to the initial discharge induction coil module 102. When the AC power PO1 of the first resonant frequency is applied to the initial discharge induction coil module 102 while a DC high-voltage pulse is applied, both ends of the initial discharge induction coil 120 have high inductance due to a high potential difference. A vertical electric field E_z may be generated in a direction of the central axis of the dielectric discharge tube 140. The vertical electric field E_z may generate capacitively coupled mode (or E-mode) plasma. The capacitively coupled mode may transition to an inductively coupled mode (or an H mode). Accordingly, current Ia flowing through the initial discharge induction coil 120 may be decreased due to an increase in actual resistance of initial discharge plasma, a load, and the AC power PO1 of the first resonant frequency may be increased due to the increase in the actual resistance of the initial discharge plasma, a load. The mode transition may be detected by monitoring the AC power PO1 or the current Ia at the first resonant frequency. The detection of the current Ia may be performed using a first detection sensor 152 disposed on an output terminal of the first RF power. The first detection sensor 152 may be a Hall sensor sensing current. Alternatively, the first detection sensor 152 may be disposed on an input terminal of the first inverter 356a to detect input current of the first inverter 356a and to monitor AC power using information of the DC power and the input current.

After the mode transition or even before the mode transition of the initial discharge, the DC high-voltage pulse VDC may be removed to stop supplying the seed charges (S240).

Preliminary main inductively coupled plasma of the first gas may be generated from the initial discharge with the AC power near the second resonant frequency fb using the plurality of unit antennas 132 and the second impedance matching network 133 (S250).

The main discharge induction coil module 103 may include the plurality of unit antennas 132, an auxiliary capacitor 134 connected between adjacent unit antennas in series, and the second impedance matching network 133. Similarly to the initial discharge induction coil module, the main discharge induction coil module 103 may have a capacitively coupled mode (or an E-mode) and an inductively coupled mode (or an H-mode). The second RF power supply 350b may output AC power P02.

The second RF power supply 350b may initially supply the AC power P1 of an initial frequency near the second resonant frequency fb such that the main discharge may stably transition to the inductively coupled mode (or the H-mode). The initial frequency may be several tens to several hundreds of kHz greater than the second resonant frequency fb. Accordingly, a potential difference applied to both ends of the unit antenna of the main discharge induction coil module 103 at the initial frequency may be greater than a potential difference applied at the second resonant frequency fb. A potential difference, applied to both ends of the unit antenna at the initial frequency, may stably generate preliminary main inductively coupled plasma using charges generated by the initial discharge. The AC power P1 of the initial frequency may be supplied after or at the same time after the E-mode transition of the initial discharge.

In the operation of generating the main inductively coupled plasma of the first gas (S260), the second RF power supply 350b may supply the AC power P2 of the second resonant frequency fb to the main discharge induction coil module 103. For example, the second RF power supply 350b may change a frequency to supply the AC power P2 of the second resonant frequency fb to the main discharge induction coil module 103. Accordingly, the AC power P2 of the second RF power supply 350b may be impedance-matched to be increased, and the main discharge induction coil module 103 may stably operate the inductively coupled mode (or the H-mode). As the frequency changes to the second resonant frequency, the current Ib flowing through the main discharge induction coil module 103 may be increased due to impedance matching. Therefore, stable main inductively coupled plasma using the first gas is maintained. The detection of the current Ib may be performed using a second detection sensor 154 disposed on an output terminal of the second RF power. The second detection sensor 154 may be a Hall sensor sensing current. Alternatively, the second detection sensor 154 may be disposed on the input terminal of the second inverter 356b to detect the input current of the second inverter 356b and to monitor AC power using information of the DC power and the input current.

Then, when the main inductively coupled plasma is generated, AC power of the first resonant frequency fa may be interrupted (S270). The interruption of the AC power of the first resonant frequency fb, provided to the initial discharge induction coil module, may be performed simultaneously with or immediately before the change to the second resonant frequency. The current Ib or the AC power P2 of the second resonant frequency fb may be detected to determine whether the main inductively coupled plasma is generated.

The first gas may be an ignition gas advantageous for igniting. The first gas may be argon, carbon dioxide, or nitrogen. On the other hand, the second gas may be a process gas which is difficult to ignite and may include a fluorine-containing gas or the like. Therefore, when a gas which is difficult to initially ignite is used, the gas may be discharged with a first gas which easily ignites and may be replaced with a second gas (S280). The main inductively coupled plasma of the first gas may change to the main inductively coupled plasma of the second gas while maintaining substantially the same pressure. Conventionally, actual plasma resistance of the fluorine-containing gas may be lower than actual resistance of an argon gas. Therefore, when the gas is replaced with the second gas, the current Ib flowing through the main discharge induction coil module 103 may be increased, and the AC power P3 of the second resonant frequency fb may be increased.

Figure 23:
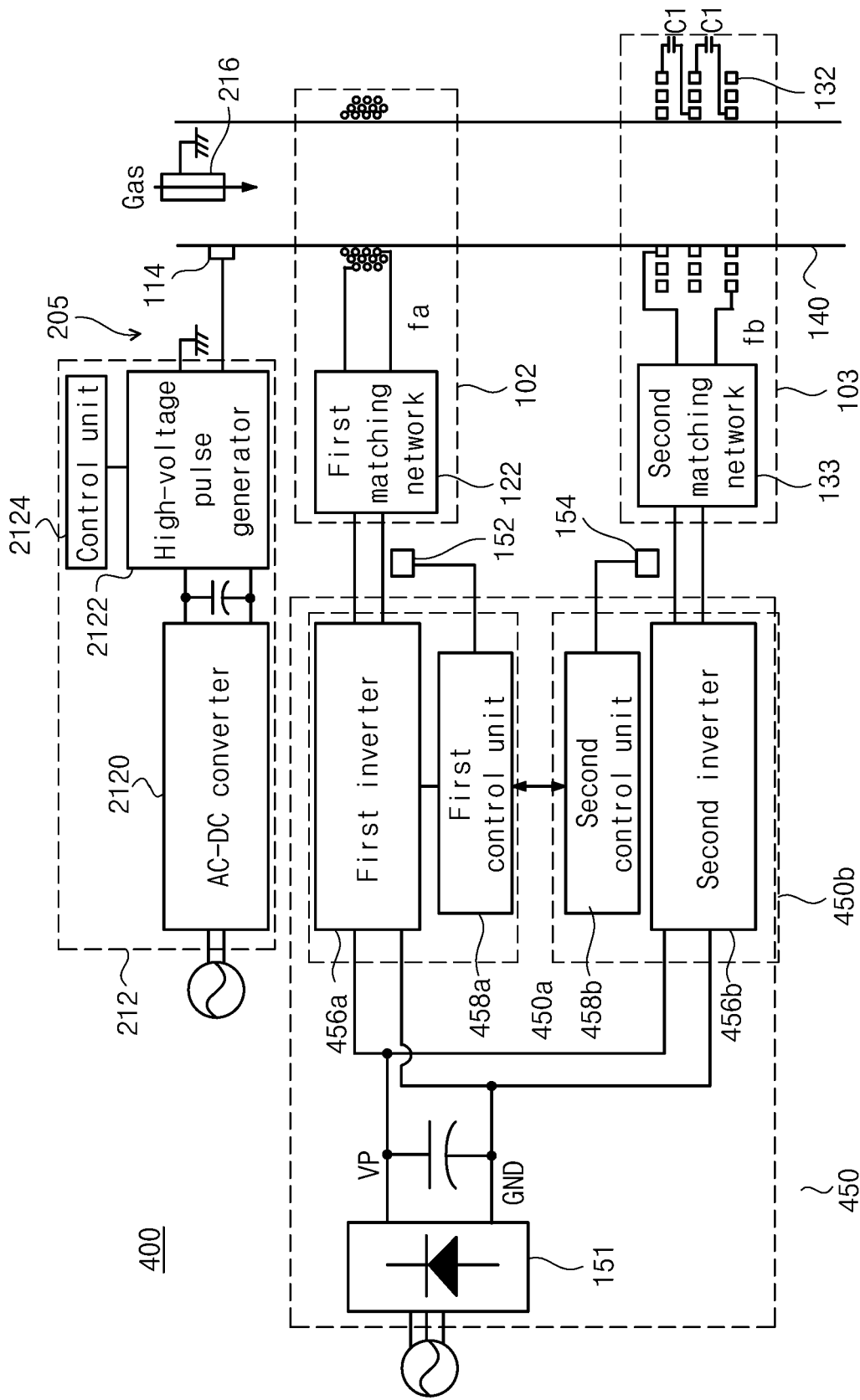
FIG. 23 is a conceptual diagram illustrating a plasma generating apparatus according to another example embodiment of the present disclosure.

FIG. 23 is a conceptual diagram illustrating a plasma generating apparatus according to another example embodiment of the present disclosure.

Referring to FIG. 23, a plasma generating apparatus 400 may include a dielectric discharge tube 140; a seed charge generator 205 disposed on the dielectric discharge tube 140 to generate seed charges in the dielectric discharge tube 140; an initial discharge induction coil module 102 including an initial discharge induction coil 120 surrounding the dielectric discharge tube 140 and receiving the seed charges to generate initial discharge and a first impedance matching network 122 connected to the initial discharge induction coil 120 to provide a first resonant frequency fa; a main discharge induction coil module 103 including at least one unit antenna 132 disposed to be spaced apart from the initial discharge induction coil 120, surrounding the dielectric discharge tube 140, receiving the initial discharge to generate main inductively coupled plasma and a second impedance matching network 133 connected to the unit antenna 132 to provide a second resonant frequency fb; and an RF power supply 450 supplying power to the initial discharge induction coil module 102 and the main discharge induction coil module 103.

The RF power supply 450 includes: a rectifier 151 converting AC power into DC power; a first RF power supply 450a receiving DC power from the rectifier 151 to provide AC power to the initial discharge induction coil module 102 and operating at the first resonant frequency fa; and a second RF power supply 450b receiving DC power from the rectifier 151 to provide AC power to the main discharge induction coil module 103 and operating at the second resonant frequency fb.

The first RF power supply 450a includes: a first inverter 456a receiving DC power from the rectifier 151 and converting the received DC power into first AC power of the first resonant frequency fa; and a first control unit 458a controlling the first inverter 456a.

The second RF power supply 450b includes: a second inverter 456b receiving DC power from the rectifier 151 and converting the received DC power into AC power of the second resonant frequency fb; and a second control unit 458b controlling the second inverter.

The rectifier of the first RF power supply 450a and the rectifier of the second RF power supply 450b may be commonly used. Since a time required to simultaneously operate the first RF power 450a and the second RF power 450b is very short, no issue occurs in the operation of the second RF power supply 450b.

Figure 24:
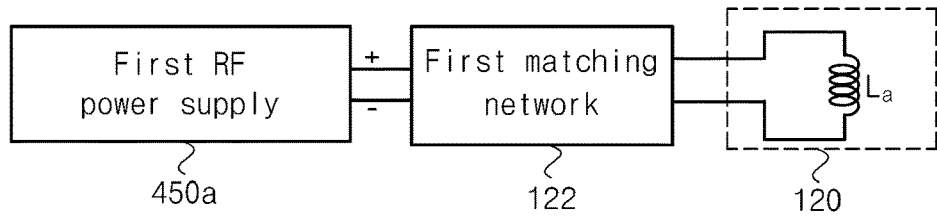
FIGS. 24 to 28 each illustrate an initial discharge induction coil module connected to a second RF power supply according to an example embodiment of the present disclosure.
Figure 25:
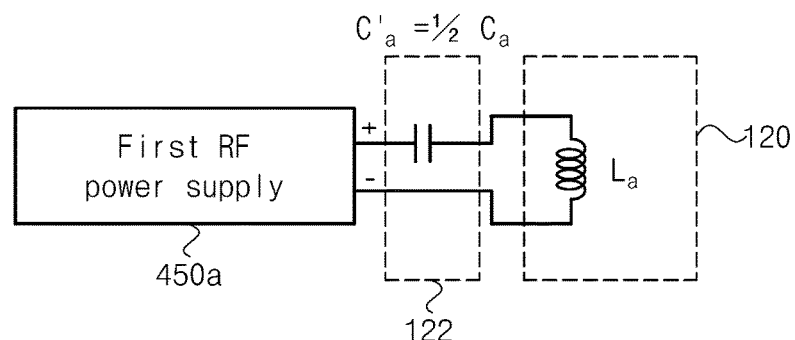

FIGS. 24 and 25 illustrate an initial discharge induction coil module connected to a first RF power supply according to an example embodiment of the present disclosure.

Referring to FIGS. 24 and 25, a first RF power supply 450a has a positive output and a negative output, and is connected to an initial ignition induction coil 120 through a first impedance matching network 122. The initial ignition induction coil 120 has high inductance of 8 uH. The first impedance matching network 122 may include at least one initial discharge capacitor. A first resonant frequency fa may be given by the inductance La of the initial discharge induction coil 120 connected to equivalent capacitance C'a of the initial discharge capacitor.

Figure 26:
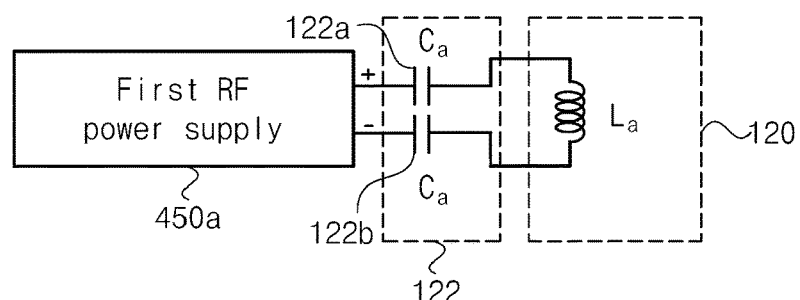

FIG. 26 illustrates an initial discharge induction coil module connected to a first RF power supply according to another example embodiment of the present disclosure.

Referring to FIG. 26, a first RF power supply 450a has a positive output and a negative output, and is connected to an initial ignition induction coil 120 through a first impedance matching network 122. The initial ignition induction coil 120 has high inductance of 8 uH. The first impedance matching network 122 may include a pair of initial discharge capacitors 122a and 122b.

The pair of initial discharge capacitors 122a and 122b are connected to both ends of the initial discharge induction coil, respectively. The positive output of the first RF power supply 450a is connected to a first initial discharge capacitor 122a, and the negative output of the first RF power supply 450a is connected to a second initial discharge capacitor 122b. A first resonant frequency fa may be defined by equivalent capacitance C'a of the pair of initial discharge capacitors 122a and 122b and inductance La of the initial discharge induction coil 120. The first initial discharge capacitor 122a and the second initial discharge capacitor 122b may have the same capacitance Ca, and the equivalent capacitance C'a may be Ca/2. The first resonant frequency fa may be given by the inductance La of the initial discharge induction coil 120 connected to the equivalent capacitance C'a of the initial discharge capacitor in series.

Figure 27:
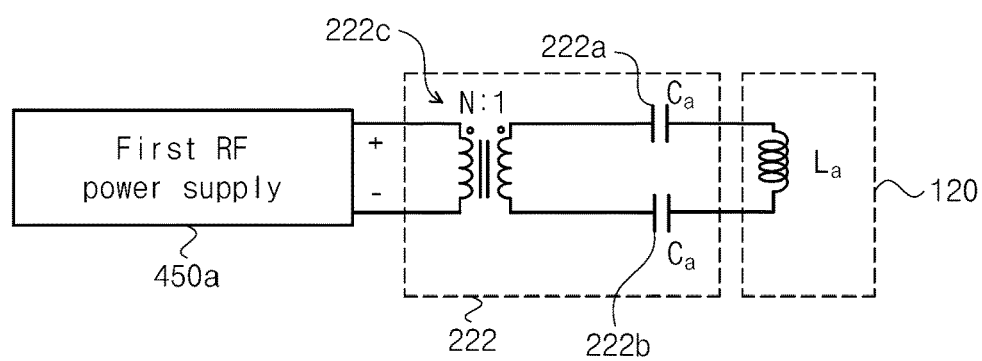

FIG. 27 illustrates an initial discharge induction coil module connected to a first RF power according to another example embodiment of the present disclosure.

Referring to FIG. 27, a first RF power supply 450a has a positive output and a negative output, and is connected to an initial ignition induction coil 120 through a first impedance matching network 222. The first impedance matching network 222 may include a transformer 222c, connected to an output terminal of the first RF power supply 450a, and a pair of initial discharge capacitors 222a and 222b, respectively connected to both ends of a initial discharge induction coil 120 in series. A primary coil of the transformer 222c may be connected to the output terminal of the first RF power supply 450a, and a secondary coil of the transformer 222c may be connected to both ends of an initial discharge induction coil and the pair of initial discharge capacitors 220a and 220b connected in series. Impedance at a side of a load may be converted depending on a turn ratio (N:1) of the transformer 222c. Capacitance of the first initial discharge capacitor and capacitance Ca of the first initial discharge capacitor may be the same. A first resonant frequency may be given by inductance La of the initial discharge induction coil 120 connected to equivalent capacitance C'a of the initial discharge capacitor in series.

Figure 28:
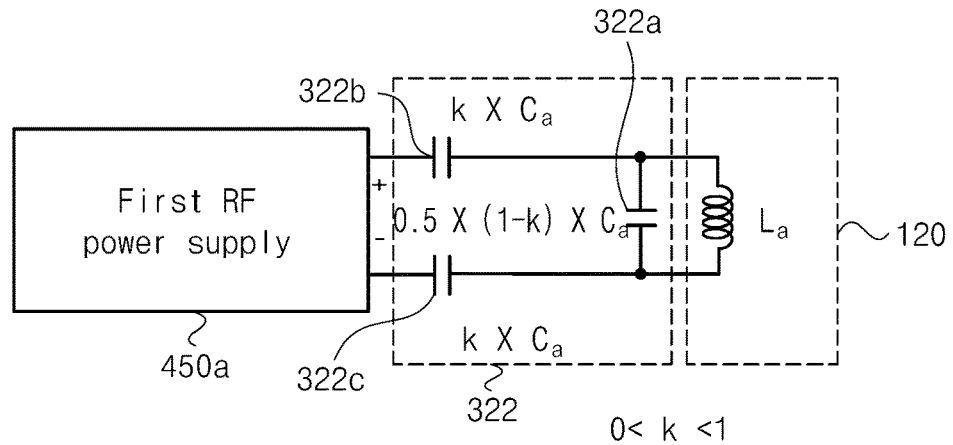

FIG. 28 illustrates an initial discharge induction coil module connected to a first RF power according to another example embodiment of the present disclosure.

Referring to FIG. 28, a first RF power supply 450a has a positive output and a negative output, and is connected to an initial ignition induction coil 120 through a first impedance matching network 322.

The first impedance matching network 322 may include a first initial discharge capacitor 322a connected to an initial discharge induction coil 120 in parallel; and a first initial discharge capacitor 322a and a second initial discharge capacitor 322b and a third initial discharge capacitor 322c connected to each other in parallel. The second initial discharge capacitor 322b and the third initial discharge capacitor 322c are connected to both ends of an initial discharge induction coil, respectively. Equivalent capacitance of the first to third initial discharge capacitors 322a, 322b, and 322c may be C'a=½ Ca. Capacitance of the first initial discharge capacitor 322a may be 0.5×(1−k)×Ca. Capacitance of the second and third initial discharge capacitors 322b and 322c may be k×Ca. Here, 0<k<1 may be in the range. Ca is the capacitance of the initial discharge capacitor described in FIG. 26. A first resonant frequency may be given by inductance La of the initial discharge induction coil 120 connected to the equivalent capacitance C'a of the initial discharge capacitor in series.

Figure 29:
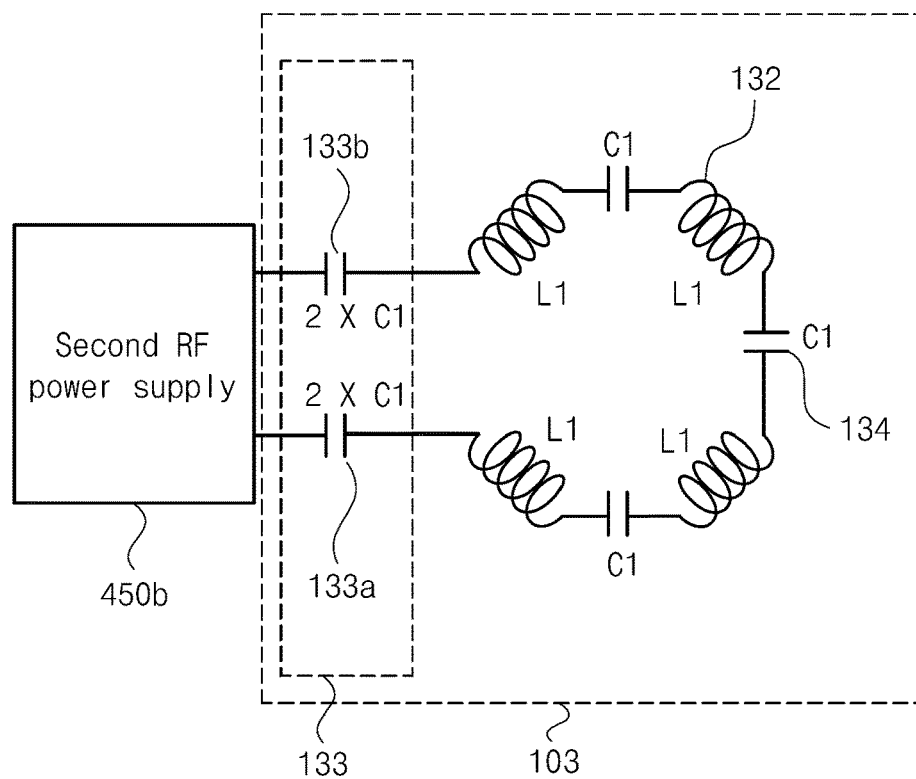
FIG. 29 illustrates a main discharge induction coil module connected to a second RF power supply according to another example embodiment of the present disclosure.

FIG. 29 illustrates a main discharge induction coil module connected to a second RF power supply according to another example embodiment of the present disclosure.

Referring to FIG. 29, a main discharge induction coil module 103 includes a plurality of unit antennas 132 connected to each other in series, an auxiliary capacitor 134 connected between adjacent unit antennas in series, and a second impedance matching network 133 connected to a plurality of unit antennas connected in series. The plurality of unit antennas 132 may be disposed on a plurality of placement planes, perpendicular to a central axis of a dielectric discharge tube, and may be connected to each other in series. The auxiliary capacitors 134 may be connected between adjacent unit antennas in series. The second impedance matching network 133 may include a first main capacitor 133a and a second main capacitor 133b, respectively connected to both ends of the unit antennas connected in series.

A second resonant frequency fb may be given by the sum of inductances of the unit antennas and equivalent capacitances of the capacitors. When capacitance of the auxiliary capacitor 134 is C1, capacitance of each of the first main capacitor 133a and the second main capacitor 133b may be 2C1. Inductance of each of the unit antennas may be L1.

Figure 30:
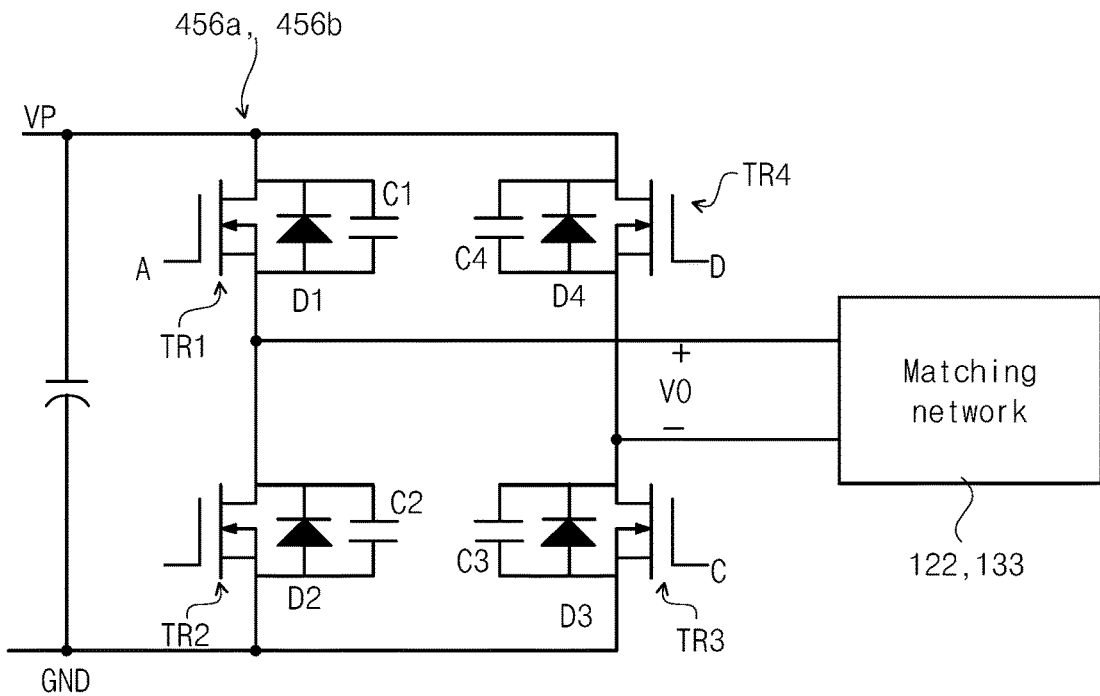
FIG. 30 is a circuit diagram of a full-bridge inverter used in a first inverter or a second inverter.

FIG. 30 is a circuit diagram of a full-bridge inverter used in a first inverter or a second inverter.

Inverters 456a and 456b receive DC power from a power supply node VP and a ground node GND. The inverters 456a and 456b receive switching signals A, B, C, and D from controllers 458a and 458b. The inverters 456a and 456b may convert DC power into AC power in response to the switching signals A, B, C, and D.

First and second transistors TR1 and TR2 may be connected between the power supply node VP and the ground node GND in series. A first diode D1 may be connected to a first transistor TR1 in parallel, and a second diode D2 may be connected to a second transistor TR2 in parallel. A first capacitor C1 may be connected to the first transistor TR1 in parallel, and a second capacitor C2 may be connected to the second transistor TR in parallel.

Third and fourth transistors TR1 and TR2 may be connected between the power supply node VP and the ground node GND in series. A third diode D3 may be connected to a third transistor TR3 in parallel, and a fourth diode D4 may be connected to the fourth transistor TR4 in parallel. A third capacitor C3 may be connected to the third transistor TR3 in parallel, and a fourth capacitor C4 may be connected to the fourth transistor TR4 in parallel.

When a driving frequency of an output voltage VO is adjusted, a phase difference between an output voltage and output current may be adjusted.

Figure 31:
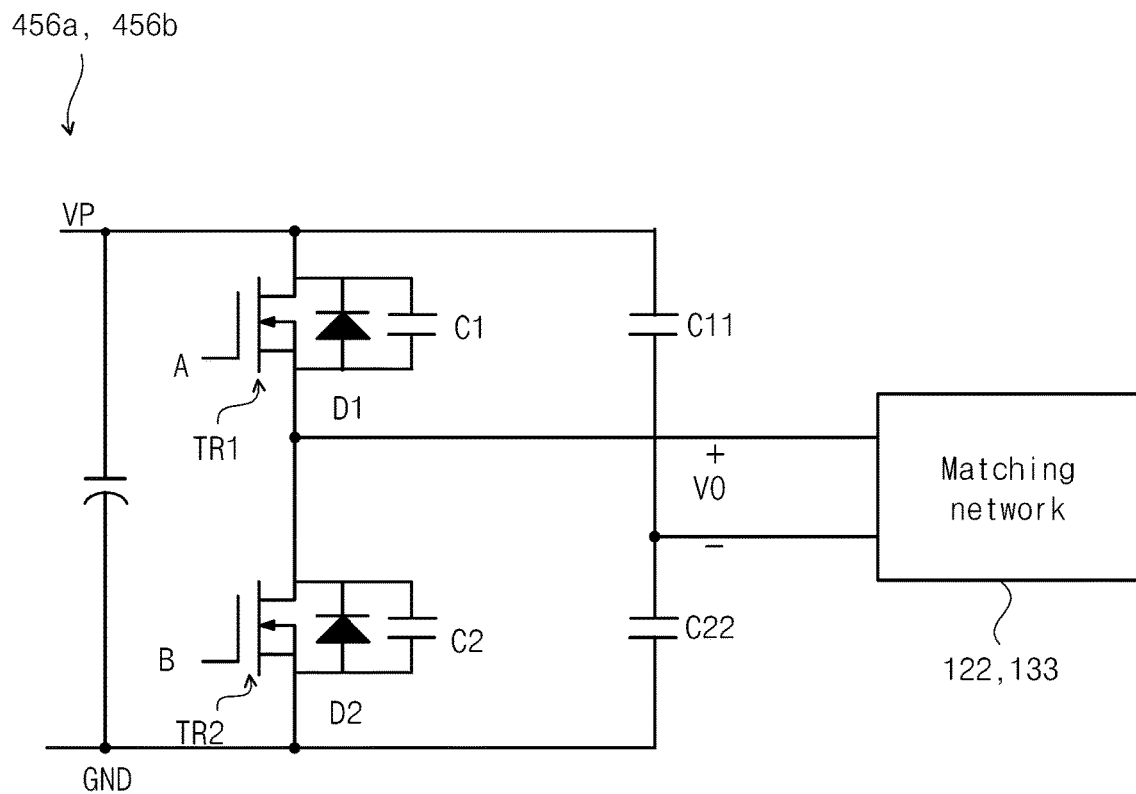
FIG. 31 is a circuit diagram of a half-bridge inverter according to an example embodiment of the present disclosure.

FIG. 31 is a circuit diagram of a half-bridge inverter according to an example embodiment of the present disclosure.

Referring to FIG. 31, inverters 456a and 456b receive DC power from a power supply node VP and a ground node GND. The inverters 456a and 456b receive switching signals A and B from controllers 458a and 458b. The inverters 456a and 456b may convert DC power into AC power in response to switching signals A and B.

First and second transistors TR1 and TR2 may be connected between the power supply node VP and the ground node GND in series. A first diode D1 may be connected to the first transistor TR1 in parallel, and the second diode D2 may be connected to the second transistor TR2 in parallel. A first capacitor C1 may be connected to the first transistor TR1 in parallel, and the second capacitor C2 may be connected to the second transistor C2 in parallel.

A first voltage divider capacitor C11 and a second voltage divider capacitor C22 may be connected between the power supply node VP and the ground node GND in series.

When a driving frequency of an output voltage VO is adjusted, a phase difference between the output voltage VO and output current may be adjusted.

Figure 32:
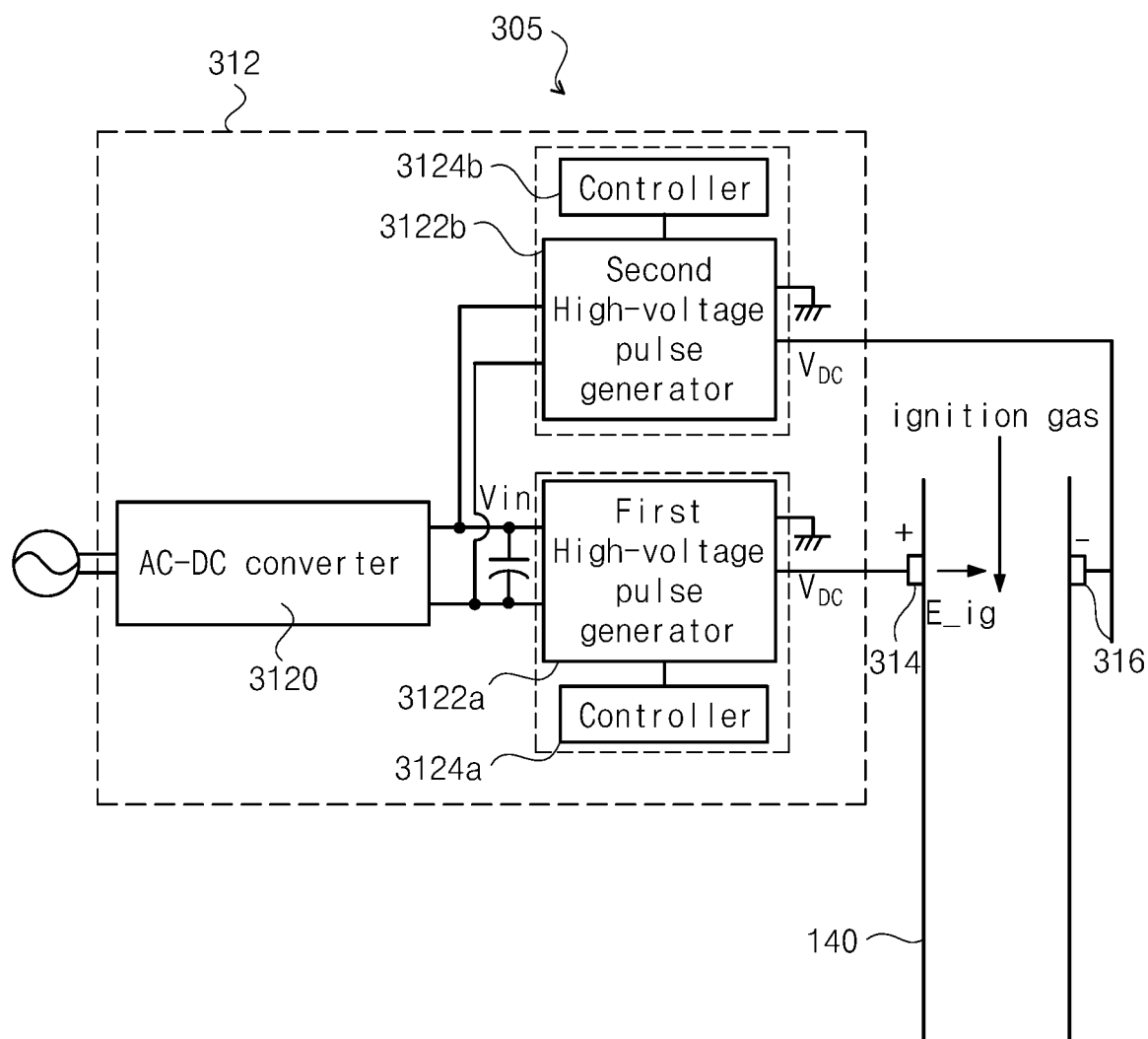
FIG. 32 is a conceptual diagram illustrating a seed charge generator according to another example embodiment of the present disclosure.

FIG. 32 is a conceptual diagram illustrating a seed charge generator according to another example embodiment of the present disclosure.

Referring to FIG. 32, a seed charge generator 305 includes a first electrode 314 and a second electrode 316 disposed on a dielectric discharge tube 140 to provide seed charges; and a DC power supply 312 applying a DC high voltage between the first electrode 314 and the second electrode 316.

The DC power supply 312 includes an AC-DC converter 3120 converting commercial AC power into a DC voltage Vin; high-voltage pulse generators 3122a and 3122b receiving the DC voltage Vin to generate at least one high-voltage pulse of a positive DC high-voltage pulse and a negative DC high-voltage pulse; and controllers 3124a and 3124b controlling the high-voltage pulse generator. The high-voltage pulse generators 3122a and 3122b may include: a first high-voltage pulse generator 3122a receiving the DC voltage to generate a first high-voltage pulse; and a second high-voltage pulse generator 3122b receiving the DC voltage to generate a second high-voltage pulse.

The controllers 3124a and 3124b, controlling the high-voltage pulse generator, may include a first controller 3124a controlling the first high-voltage pulse generator 3122a and a second controller 3124b controlling the second high-voltage pulse generator 3122b. A first high-voltage pulse may be applied to the first electrode 314, and a second high-voltage pulse may be applied to the second electrode 316. The first electrode 314 and the second electrode 316 may be disposed to be spaced apart from each other on an external sidewall of the dielectric discharge tube 140. The first high-voltage pulse and the second high-voltage pulse may have polarities opposite to each other.

Returning to FIGS. 10 and 11, the DC power supply 112, applying a DC high voltage, may generate a positive high-voltage pulse and/or a negative high-voltage pulses. The negative high-voltage pulse and the positive high-voltage pulse may be applied to the first electrode 314 and the second electrode 316, respectively.

Figure 33:
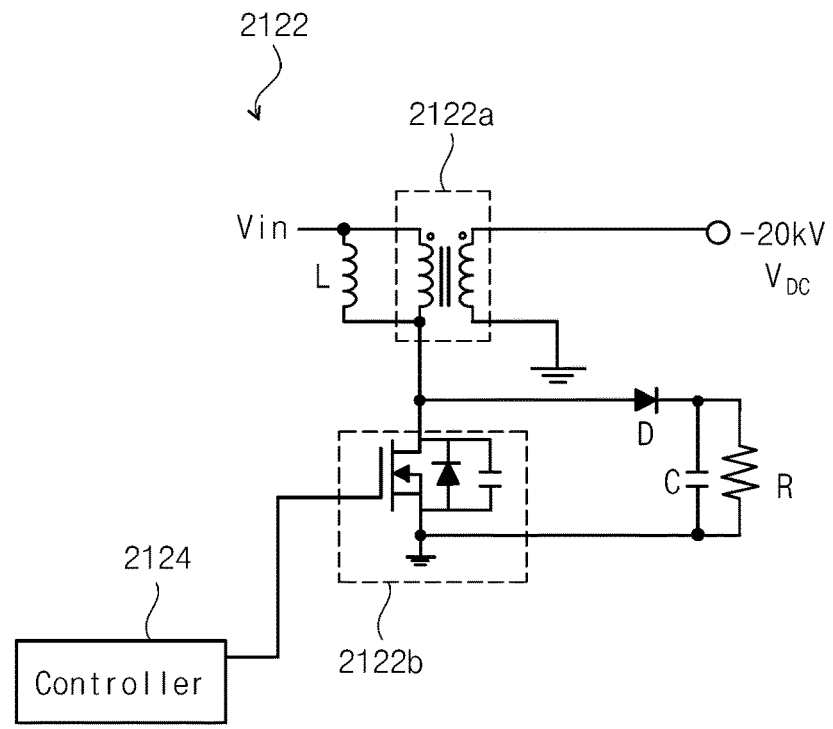
FIG. 33 to FIG. 36 are conceptual diagrams of a high-voltage pulse generation unit according to another example embodiment of the present disclosure.

FIG. 33 is a conceptual diagram illustrating a negative high-voltage pulse generator according to an example embodiment of the present disclosure.

Referring to FIG. 33, a high-voltage pulse generator 2122 includes a transformer 2122a including a primary coil receiving a DC voltage Vin of an AC-DC converter 2120 and a secondary coil generating a negative DC high voltage pulse; an inductor L connected to the primary coil 2122a of the transformer 2122a in parallel; a power transistor 2122b connected to the primary coil of the transformer 2122a in series and having an end grounded; a resistor R connected to the power transistor 2122b in parallel; a capacitor C connected to the power transistor 2122b in parallel; and a diode D disposed between the other end of the power transistor 2122b and the resistor R and the capacitor C connected in parallel. A controller 2124 controls a gate of the power transistor 2122b.

One end of the secondary coil of the transformer 2122a may output a negative DC high-voltage pulse, and the other end of the secondary coil of the transformer 2122a may be grounded.

Figure 34:
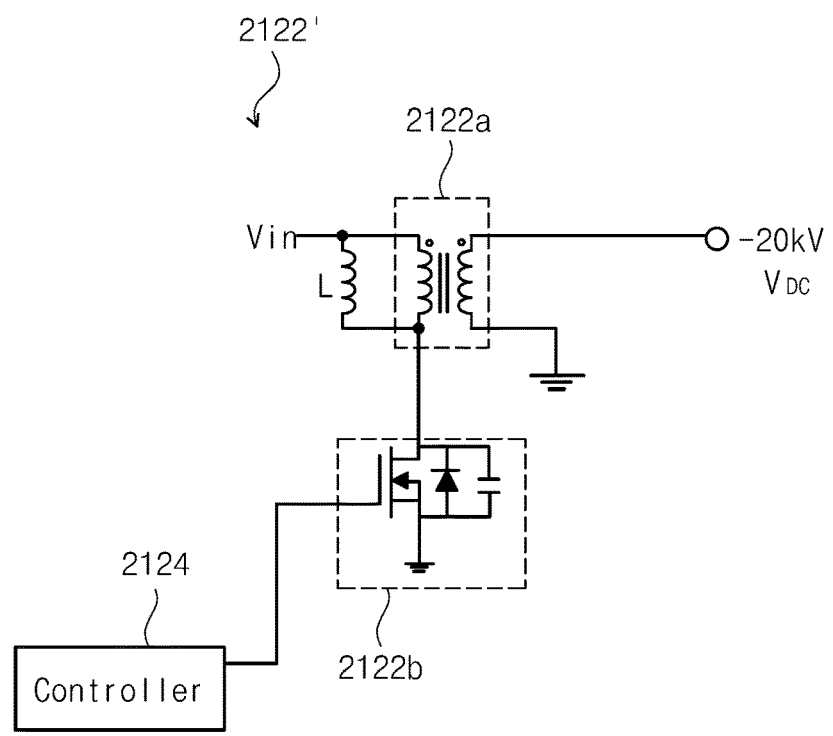

FIG. 34 is a conceptual diagram illustrating a negative high-voltage pulse generator according to another example embodiment of the present disclosure.

Referring to FIG. 34, a voltage pulse generator 2122' includes a transformer 2122a including a primary coil receiving a DC voltage Vin of an AC-DC converter 2120 and a secondary coil generating a negative DC high-voltage pulse; an inductor L connected to the primary coil of the transformer 2122a in parallel; and a power transistor 2122b connected between a ground and the primary coil of the transformer 2122a in series. A controller 2124 may control a gate of the power transistor 2122, and one end of the secondary coil of the transformer 2122a may output a negative DC high-voltage pulse, and the other end of the secondary coil of the transformer 2122a may be grounded.

Figure 35:
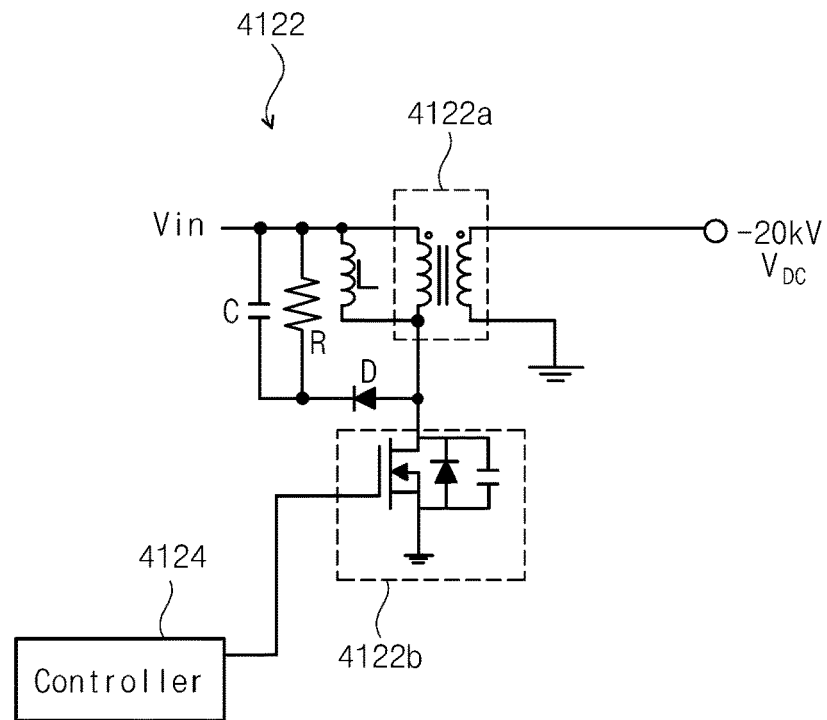

FIG. 35 is a conceptual diagram illustrating a negative high-voltage pulse generator according to another example embodiment of the present disclosure.

Referring to FIG. 35, a high-voltage pulse generator 4122 includes a transformer 4122a including a primary coil receiving a DC voltage of an AC-DC converter 2120 and a secondary coil generating a positive DC high-voltage pulse; an inductor L connected to the primary coil of the transformer 4122a in parallel; a power transistor 4122b connected between a ground and the primary coil of the transformer 4122a in series; a resistor R and a capacitor C having one end connected to the DC voltage Vin of the AC-DC converter 2120 and connected to each other in parallel; and a diode D having one end connected between the power transistor 4122b and the primary coil and the other end connected to the other end of the resistor R and the capacitor C connected to each other in parallel. A controller 4124 controls a gate of the power transistor 412b, and one end of the secondary coil of the transformer 4122a may output a negative DC high-voltage pulse, and the other end of the secondary coil of the transformer 4122a may be grounded.

Figure 36:
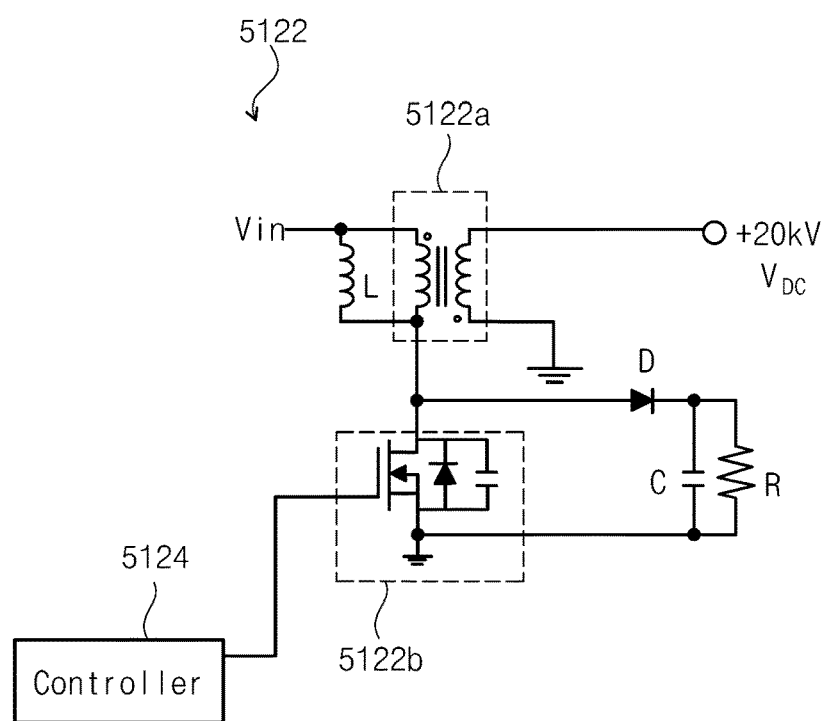

FIG. 36 is a conceptual diagram illustrating a positive high-voltage pulse generator according to another example embodiment of the present disclosure.

Referring to FIG. 36, a high-voltage pulse generator 5122 includes a transformer 5122a including a primary coil receiving a DC voltage Vin of an AC-DC converter 2120 and a secondary coil generating a positive DC high-voltage pulse; an inductor L connected to the primary coil of the transformer 5122a in parallel; a power transistor 5122b connected between a ground and the primary coil of the transformer 5122a in series; a resistor R connected to the power transistor 5122b in parallel; a capacitor C connected to the power transistor 5122b in parallel; and a diode D disposed between the other end of the power transistor 5122b and the resistor R and the capacitor C connected to each other in parallel. The primary coil and the secondary coil have a phase difference of 180 degrees, the controller 5124 controls a gate of the power transistor 5122b, and one end of the secondary coil of the transformer 5122a outputs a positive DC high-voltage pulse and the other end of the secondary coil of the transformer 5122a is grounded.

Figure 37:
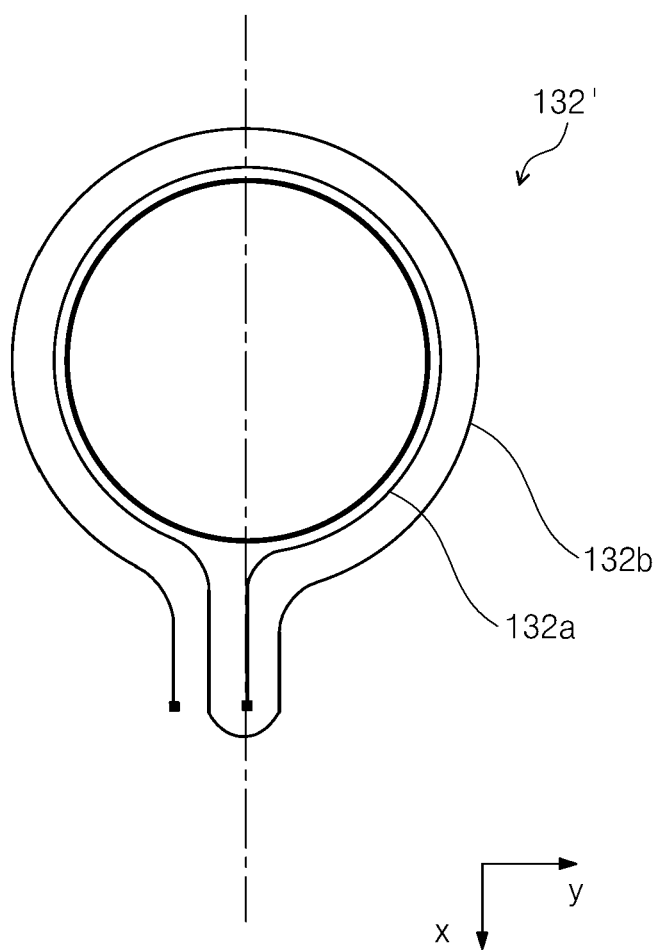
FIG. 37 is a plan view of a unit antenna of a main discharge induction coil module according to another example embodiment of the present disclosure.

FIG. 37 is a plan view of a unit antenna of a main discharge induction coil module according to another example embodiment of the present disclosure.

Referring to FIG. 37, a unit antenna 132' may include a first antenna disposed to be in contact with the dielectric discharge tube 140 on a placement plane, perpendicular to a central axis of a dielectric discharge tube, and forming a loop 132a and a second antenna 132b continuously connected to the first antenna 132a, disposed to surround the first antenna, and forming a loop. The unit antenna 132' has a rectangular cross section, and the first antenna 132a is in close contact with the dielectric discharge tube to cool the dielectric discharge tube.

As described above, an atmospheric-pressure plasma generating apparatus according to an example embodiment may stably generate plasma at atmospheric pressure or higher pressure using an electrode for generating seeds, an initial discharge induction coil advantageous for ignition, and a main discharge induction coil module advantageous for maintaining discharge.

While example embodiments have been shown and described above, it will be apparent to those skilled in the art that modifications and variations could be made without departing from the scope of the present inventive concept as defined by the appended claims.

The invention claimed is:

1. A plasma generating apparatus for reforming a target gas, comprising:
a discharging tube comprising an inlet in which the target gas is flowed into and an outlet in which a reformed gas is emitted,
wherein the inlet is disposed at a first end of the discharging tube and the outlet is disposed at a second end of the discharging tube opposite to the first end;
a first coil surrounding an outer surface of the discharging tube, wherein the first coil is closer to the inlet than a second coil; and
the second coil surrounding the outer surface of the discharging tube, wherein the second coil is closer to the outlet than the first coil, and
wherein the second coil comprises a plurality of turn coils,
wherein the plurality of turn coils comprise (i) first and second turn coils surrounding the outer surface of the discharging tube and having a first radius of curvature around a central axis of the discharging tube and (ii) third and fourth turn coils having a second radius of curvature greater than the first radius of curvature and around the central axis of the discharging tube,
wherein the first and the third turn coils are disposed on a first plane perpendicular to the central axis,
wherein the second and the fourth turn coils are disposed on a second plane, which is adjacent from the first plane and perpendicular to the central axis,
wherein the second coil further comprises a capacitor electrically interposed between the first turn coil and one of the third and the fourth turn coils,
wherein a second inductance which is a total sum of inductances of the plurality of turn coils is greater than a first inductance of the first coil, and
wherein each of the inductances of the plurality of turn coils is less than the first inductance.

2. The plasma generating apparatus of claim 1, further comprising:
a seed charge generator for generating a seed charge inside the discharging tube.

3. The plasma generating apparatus of claim 2, wherein the seed charge generator comprises an electrode.

4. The plasma generating apparatus of claim 3, wherein the seed charge generator is closer to the first coil than the second coil.

5. The plasma generating apparatus of claim 2, wherein the seed charge generator comprises a first electrode and a second electrode, and
wherein the first coil is disposed between the first electrode and the second electrode in a parallel direction to a central axis of the discharging tube.

6. The plasma generating apparatus of claim 2, further comprising:
a pulse generator providing a pulse voltage to the seed charge generator,
wherein the seed charge is generated inside the discharging tube by providing a Direct Current (DC) voltage to the seed charge generator by the pulse generator.

7. The plasma generating apparatus of claim 1, further comprising:
a power supplier for providing an Alternating Current (AC) voltage to at least one of the first coil and the second coil.

8. The plasma generating apparatus of claim 1, further comprising:
a first power supplier connected to a first end and a second end of the first coil and providing a first Alternating Current (AC) voltage to the first coil through the first end and the second end, and
a second power supplier connected to a third end and a fourth end of the second coil and providing a second Alternating Current (AC) voltage to the second coil through the third end and the fourth end.

9. The plasma generating apparatus of claim 1, wherein the target gas is at least one gas selected from a group consisting of carbon fluoride ($C_aF_b$), sulfur fluoride ($S_cF_d$), and carbon oxide ($C_eO_f$), and
wherein a, b, c and d are a natural number equal to or greater than 1, e is 1 and f is 2.

* * * * *